United States Patent
Pajovic et al.

(10) Patent No.: US 10,564,222 B2
(45) Date of Patent: Feb. 18, 2020

(54) METHODS AND SYSTEMS FOR BATTERY STATE OF POWER PREDICTION

(71) Applicant: Mitsubishi Electric Research Laboratories, Inc., Cambridge, MA (US)

(72) Inventors: Milutin Pajovic, Cambridge, MA (US); Zafer Sahinoglu, Los Angeles, CA (US); Yebin Wang, Acton, MA (US); Philip Orlik, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 384 days.

(21) Appl. No.: 15/655,788

(22) Filed: Jul. 20, 2017

(65) Prior Publication Data

US 2019/0025379 A1  Jan. 24, 2019

(51) Int. Cl.
  G01R 31/367 (2019.01)
(52) U.S. Cl.
  CPC ................... G01R 31/367 (2019.01)
(58) Field of Classification Search
  None
  See application file for complete search history.

(56) References Cited

U.S. PATENT DOCUMENTS

| 9,465,078 | B2* | 10/2016 | Betzner | H01M 10/486 |
| 2015/0226135 | A1* | 8/2015 | Geveci | F02D 29/02 |
| | | | | 701/22 |
| 2016/0039419 | A1* | 2/2016 | Wampler | B60W 10/26 |
| | | | | 701/22 |
| 2017/0131363 | A1* | 5/2017 | Scott | G01R 31/389 |

OTHER PUBLICATIONS

Xia Hong et al., "Estimation of Gaussian Process Regression Model using Probability Distance Measures," Systems Science and Control Engineering, vol. 2, No. 1, Oct. 31, 2014. pp. 655-663.

(Continued)

*Primary Examiner* — John E Breene
*Assistant Examiner* — Brandon J Becker
(74) *Attorney, Agent, or Firm* — Gennadiy Vinokur; James McAleenan; Hironori Tsukamoto

(57) ABSTRACT

Methods and systems for predicting an unknown voltage of a battery corresponding to a future current demand for at least one time instant. The method including determining parameters of a first joint Gaussian distribution of a set of historical values of the voltage prediction of the battery from a set of historical measured physical quantities of the state of the battery stored in the memory. Determining a second joint Gaussian distribution of the unknown voltage and the set of historical values of the voltage prediction of the battery, based on a present measured physical quantities of the battery, the set of historical measured physical quantities and the determined parameters of the first joint Gaussian distribution. Determining a mean and a variance of an unknown voltage of the battery from the second joint Gaussian distribution, to obtain the predicted unknown voltage of the battery.

20 Claims, 16 Drawing Sheets

(56) References Cited

OTHER PUBLICATIONS

Ozcan Gozde et al., "Online Battery State of Charge Estimation Based on Sparse Gaussian Process Regression," 2016 IEEE Power and Energy Society General Meetings, IEEE. Jul. 17, 2016. pp. 1-5.

Pajovic et al., Online Data Driven Battery Voltage Prediction, Mitsubishi Electric Research Labs, Jul. 2015. www.merl.com/publications/docs/TR2017-101.pdf.

Datong Liu et al., "Data Driven Prognostics for Lithium Ion Battery based on Gaussian Process Regression," Prognostics and System Health Management, 2012, IEEE Conference on, May 23, 2012. pp. 1-5.

* cited by examiner

Algorithm 1 Training stage of the one-step predictor

1: Input: Training data $\mathcal{D} = \{(x_{t,1}, y_{t,1}), \ldots, (x_{t,N}, y_{t,N})\}$
2: Input: Kernel function $\kappa(\cdot, \cdot)$ parameterized by $\mathcal{H}$
3: Run optimization: $\hat{\mathcal{H}} = \arg\min_{\mathcal{H}} \text{NLL}(\mathcal{D}; \mathcal{H})$
4: Evaluate inverse covariance matrix $\Sigma^{-1}$ for $\hat{\mathcal{H}}$ using (4)
5: Output: Learned hyper-parameters $\hat{\mathcal{H}}$
6: Output: Inverse covariance matrix $\Sigma^{-1}$

FIG. 6A

Algorithm 2 Operational stage of the one-step predictor

1: Input: Training data $\mathcal{D} = \{(x_{t_1}, y_{t_1}), \ldots, (x_{t_N}, y_{t_N})\}$
2: Input: Kernel function $\kappa(\cdot, \cdot)$ and hyper-parameters $\mathcal{H}$
3: Input: Inverse covariance matrix $\Sigma^{-1}$
4: Input: Measurements $V_t, I_t, T_t, \ldots, V_{t-L}, I_{t-L}, T_{t-L}$
5: Input: Future current $I_{t+1}$
6: $y = \begin{bmatrix} y_{t_1} & y_{t_2} & \cdots & y_{t_N} \end{bmatrix}^T$
7: $x_t = \begin{bmatrix} I_{t+1} & V_t & I_t & T_t & \cdots & V_{t-L} & I_{t-L} & T_{t-L} \end{bmatrix}^T$
8: $[\kappa]_i = \kappa(x_{t_i}, x_t), i = 1, \ldots, N$
9: $\kappa_0 = \kappa(x_t, x_t)$
10: $\mu_t = \kappa^T \Sigma^{-1} y$
11: $\sigma_t^2 = \kappa_0 - \kappa^T \Sigma^{-1} \kappa$
12: Output: Predicted mean $\mu_t$ and variance $\sigma_t^2$

FIG. 6B

Algorithm 3 P-MSVP: Training stage

1: Input: Training data $\mathcal{D} = \{((x_{t_1}, y_{t_1}), \ldots, (x_{t_N}, y_{t_N}))\}$
2: Input: Kernel function $\kappa(\cdot, \cdot)$ parameterized by $\mathcal{H}$
3: for $m = 1 : M$ do
4:     Downsample $\mathcal{D}$ by $m$ to obtain $\mathcal{D}^{(m)}$
5:     Run optimization: $\hat{\mathcal{H}}^{(m)} = \arg\min_{\mathcal{H}} \text{NLL}(\mathcal{D}^{(m)}, \mathcal{H})$
6:     Evaluate corresponding $\Sigma_m^{-1}$ using (4)
7: end for
8: Outputs: $\hat{\mathcal{H}}^{(m)}, m = 1, \ldots, M$
9: Outputs: $\Sigma_m^{-1}, m = 1, \ldots, M$

FIG. 7A

Algorithm 4 P-MSVP: Operational stage

1: Input: Training data $\mathcal{D} = \{(x_{t_1}, y_{t_1}), \ldots, (x_{t_N}, y_{t_N})\}$
2: Input: Kernel function $\kappa(\cdot, \cdot)$ parameterized by $\mathcal{H}$
3: Input: Measurements $V_t, I_t, T_t, \ldots$
4: Input: Future current demand $I_{t+1}, \ldots, I_{t+M}$
5: for $m = 1 : M$ do
6:    Downsample $\mathcal{D}$ by $m$ to obtain $\mathcal{D}^{(m)}$
7:    Format $x_t^{(m)}$ as in (17)
8:    $[\kappa]_i = \kappa(x_t^{(m)}, x_{t_i}), i = 1, \ldots, |\mathcal{D}^{(m)}|, x_{t_i} \in \mathcal{D}^{(m)}$
9:    $\kappa_0 = \kappa(x_t^{(m)}, x_t^{(m)})$
10:    $\mu_t^{(m)} = \kappa^T \Sigma^{-1} y$
11:    $\sigma_t^{2,(m)} = \kappa_0 - \kappa^T \Sigma^{-1} \kappa$
12: end for
13: Outputs: $\mu_t^{(m)}, \sigma_t^{2,(m)}, m = 1, \ldots, M$

FIG. 7B

Algorithm 5 Operational stage of the R-MSVP

1: Input: Training data $\mathcal{D} = \{(x_{t_1}, y_{t_1}), \ldots, (x_{t_N}, y_{t_N})\}$
2: Input: Kernel function $\kappa(\cdot, \cdot)$ and hyper-parameters $\mathcal{H}$
3: Input: Inverse covariance matrix $\Sigma^{-1}$
4: Input: Measurements $V_t, I_t, T_t, \ldots, V_{t-L}, I_{t-L}, T_{t-L}$
5: Input: Future currents $I_{t+1}, \ldots, I_{t+M}$
6: $y = [\ y_{t_1}\ \ y_{t_2}\ \cdots\ y_{t_N}\ ]^T$
7: for $m = 1 : M$ do
8: $\quad$ Format $x_t^{(m)}$ as in (19)
9: $\quad [\kappa]_i = \kappa(x_t^{(m)}, x_{t_i}), i = 1, \ldots, N$
10: $\quad \kappa_0 = \kappa(x_t^{(m)}, x_t^{(m)})$
11: $\quad \mu_t^{(m)} = \kappa^T \Sigma^{-1} y$
12: end for
13: Output: Predicted voltages $\hat{V}_{t+m} = \mu_t^{(m)}, m = 1, \ldots, M$

FIG. 8

METHODS AND SYSTEMS FOR BATTERY STATE OF POWER PREDICTION

FIELD

The present disclosure relates to methods and systems for a data-driven State of Power (SoP) estimation of a battery. More particularly, the present disclosure relates to predicting battery voltage (current) corresponding to a given future current (voltage) demand, that is known to a battery management system (BMS) of a battery.

BACKGROUND

Methods for battery state estimation can be divided into model-based and data-driven based methods. For model-based approaches, the SoP is estimated from the state of health (SoH) and state of current (SoC) (as well as resistances), and therefore the estimation accuracy depends on the quality of the SoH/SoC estimators. However, achieving accurate SoH/SoC estimation is difficult for batteries with "flat"—Open Circuit Voltage (OCV) characteristics, such as lithium iron phosphate (LiFePO4) battery, Toshiba's rechargeable battery (SCiB), nickel-metal hydride (NiMH) battery, because of poor observability of the SoH and SoC from the measurements, among other things. The direct estimation of the SoP from the measurements can have stronger observability, nevertheless there are no known models of today, which are physically understandable. We are not aware of data-driven methods for battery SoP estimation for today's applications. This is probably due to the fact that battery SoP estimation has received a lot less attention than battery SoC and SoH estimation, and thus, why we are not aware of any known data-driven methods for battery SoP estimation.

Therefore, there is great importance and technological need for data-driven methods for battery SoP estimation for battery management systems.

SUMMARY

The present disclosure relates to methods and systems for a data-driven battery State of Power (SoP) estimation of a battery. In particular, predicting battery voltage (current) corresponding to a given future current (voltage) demand, that is known to a battery management system (BMS) of a battery.

Embodiments of the present disclosure are based on recognition that predicting battery voltage can be more accurate using a data-driven method that directly predicts the battery voltage from a predetermined voltage demand profile using historical measurements along with current measurements.

Initially, we experimented using model-based approaches for predicting battery voltage corresponding to a given future current demand. However, we learned model-based approaches require observability of State of Power (SoP) from measurements, which we found is especially problematic in batteries with flat open circuit voltage (OCV) characteristic. For example, the SoP is estimated from the state of health (SoH) and state of charge (SoC) (as well as resistances) of the battery, and therefore an estimation accuracy depends on a quality of the SoH/SoC estimators. Wherein, we found achieving accurate SoH/SoC estimation turned out to be difficult for batteries with "flat" OCV characteristics, such as LiFePO4, SCiB, NiMH batteries, because these types of batteries have poor observability of the SoH and SoC from the measurements. Thus, we realized that direct estimation of the SoP from the measurements have stronger observability, nevertheless there are no models which are physically understandable that we know of. This motivated us to undertake the data-driven approach.

In experimenting with data-driven methods, we obtained better estimation performance over the model-based approaches. Another advantage of data-driven approach for battery state of power prediction is a relatively easy way of re-training. Namely, one of the biggest issues in battery SoP, SoC and SoH estimation is battery aging. As the battery ages, its capability to store energy diminishes over time and the SoH decreases. Therefore, re-training is required. Essentially, to re-train the data-driven model, we need to disconnect the battery from the operation (i.e., load) and measure voltage, current, temperature and corresponding SoC over a wide range of SoC values in a lab setting, which is highly impractical. However, this is not the case in the data-driven battery SoP prediction. In particular, the training data is obtained during battery's operation and the re-training, when needed, is also done online.

To that end, the present disclosure is founded on another realization that we could use two approaches belonging to a class of data-driven methods based on a Gaussian Process Regression (GPR) framework. For example, the GPR framework we found accurately models complicated battery dynamics using training data. Further, the setup using the GPR provides for easy access to the training data whenever the necessity for retraining arises, such as, due to battery aging, or considerably changed temperature conditions (i.e., daily and seasonal temperature variations). We submit the approaches or algorithms of the present disclosure can address diverse battery operating conditions involving smooth and abruptly changing voltage/current measurements with both relatively small and large training datasets. For example, if the battery is charged and discharged with constant current, the current abruptly changes at time instants when the current value is changed from charging to discharging the battery. On the other hand, discharge current from the battery into load might smoothly vary in time. The first algorithm of the present disclosure is a Parallel Multi-Step Voltage Prediction (P-MSVP) that consists of multiple parallel one-step predictors acting upon appropriately down sampled measurements. The second algorithm of the present disclosure is a Recursive Multi-Step Voltage Prediction (R-MSVP) that comprises of a one-step predictor which performs multiple one step ahead voltage predictions recursively.

In addressing the problem for predicting battery voltage corresponding to a future current profile, assuming it is known and available to the BMS, we found that two algorithms (P-MSVP and R-MSVP) are particularly suited for a number of applications, for example, in uninterruptible power supply (UPS) systems, by non-limiting example. For instance, assume the present time is t, we propose that the two algorithms (P-MSVP and R-MSVP) predict voltage corresponding to future time t+T, assuming the current demand at t+T is known. Further, given that the true value of the quantity being estimated can be available immediately after the time period T, this setting enables a relatively easy access to the training data at any time of operation. Namely, the training data can be easily available when the utilized model of the present disclosure needs to be retrained, because of the battery aging, considerable change in the outside temperature, change of the load resistance, etc. We proposed the two algorithms based on data-driven approach for several reason, among many, because the models learned from data-driven methods according to the present disclosure are able to more accurately fit the actual battery dynamics than conventional models. Moreover, the proposed data-driven algorithms of the present disclosure can be relatively easily cast to solve alternative problems of predicting the current corresponding to future voltage demand. Further, we note that once the voltage is predicted, the battery SoP can be given as a product between the predicted voltage and the current demand.

We also realized that Bayesian non-parametric approach is suitable for modeling highly complicated input-output relations with relatively small training datasets. Consequently, the proposed voltage prediction algorithms (P-MSVP and R-MSVP), based on the GPR framework, embody the Bayesian non-parametric approach. For example, the GPR models unknown quantity as a Gaussian distributed random variable whose predicted mean is a point estimate, while the predicted variance is used to quantify the uncertainty in the point estimate. This uncertainly quantification, which naturally follows from the GPR framework, is one of the GPR advantages over other methods, among many advantages. The GPR framework of the present disclosure can be successfully applied for battery SoH, as well as SoC estimation.

Further, even though an essence of the problem of the present disclosure is to predict battery voltage corresponding to future current demand, we discovered we are also able to solve an equivalent problem, to predict current given the future voltage demand. For example, we assume the measurements of battery's physical quantities (such as voltage, current and temperature) up to the present time are available and utilized for voltage prediction. Such that, formally, the measurements of the voltage, current and temperature of a battery at discrete time t can be denoted, respectively, as Vt, It and Tt. Wherein, the measurements can be taken with the sampling period _T. The future current demand at M subsequent time instants t+1; . . . ; t+M, following the time instant t, is It+1; . . . ; It+M. Which leads us to our goal to predict voltage corresponding to the future current demand, i.e., to estimate Vt+1; . . . ; Vt+M using the available data.

According to a method of the present disclosure, the method is for predicting an unknown voltage of a battery corresponding to a future current demand for at least one time instant, while the battery is in communication with at least one processor connected to a memory. The method including determining parameters of a first joint Gaussian distribution of a set of historical values of the voltage prediction of the battery from a set of historical measured physical quantities of the state of the battery stored in the memory. Further, determining a second joint Gaussian distribution of the unknown voltage and the set of historical values of the voltage prediction of the battery, based on a present measured physical quantities of the battery, the set of historical measured physical quantities and the determined parameters of the first joint Gaussian distribution. Determining a mean and a variance of an unknown voltage of the battery from the second joint Gaussian distribution. Wherein the mean is a prediction of the unknown voltage of the battery, and the variance is a confidence of the prediction, so as to obtain the predicted unknown voltage of the battery corresponding to the future current demand for the at least one time instant. Wherein steps of the method are determined using the at least one processor and the memory.

According to another method of the disclosed subject matter, the method is for predicting an unknown current of a rechargeable battery corresponding to a future voltage demand for at least one time instant, while the rechargeable battery is in communication with at least one processor connected to a memory. The method including determining parameters of a first joint Gaussian distribution of a set of historical values of the current prediction of the rechargeable battery from a set of historical measured physical quantities of the state of the rechargeable battery stored in the memory. Determining a second joint Gaussian distribution of the unknown voltage and the set of historical values of the current prediction of the rechargeable battery, based on a present measured physical quantities of the rechargeable battery, the set of historical measured physical quantities and the determined parameters of the first joint Gaussian distribution. Determining a mean and a variance of an unknown current of the rechargeable battery from the second joint Gaussian distribution. Wherein the mean is a prediction of the unknown current of the rechargeable battery, and the variance is a confidence of the prediction, so as to obtain the predicted unknown current of the rechargeable battery corresponding to the future voltage demand for the at least one time instant. Wherein steps of the method are determined using the at least one processor and the memory.

According to a system of the present disclosure, the system is for predicting an unknown voltage of a battery corresponding to a future current demand for at least one time instant. The system including a memory having stored thereon data including battery related data and data for predicting unknown voltage of batteries corresponding to future current demands. At least one processor operatively connected to the memory. The processor is configured to determine parameters of a first joint Gaussian distribution of a set of historical values of the voltage prediction of the battery from a set of historical measured physical quantities of the state of the battery stored in the memory. Determine a second joint Gaussian distribution of the unknown voltage and the set of historical values of the voltage prediction of the battery, based on a present measured physical quantities of the battery, the set of historical measured physical quantities and the determined parameters of the first joint Gaussian distribution. Determine a mean and a variance of an unknown voltage of the battery from the second joint Gaussian distribution, wherein the mean is a prediction of the unknown voltage of the battery, and the variance is a confidence of the prediction, so as to obtain the predicted unknown voltage of the battery corresponding to the future current demand for the at least one time instant.

Further features and advantages will become more readily apparent from the following detailed description when taken in conjunction with the accompanying drawings.

DESCRIPTION OF THE DRAWINGS

The present disclosure is further described in the detailed description which follows, in reference to the noted plurality of drawings by way of non-limiting examples of exemplary embodiments of the present disclosure, in which like reference numerals represent similar parts throughout the several views of the drawings. The drawings shown are not necessarily to scale, with emphasis instead generally being placed upon illustrating the principles of the presently disclosed embodiments.

FIG. 6A is flow chart of the training stage of the one-step voltage prediction, according to embodiments of the present disclosure;

FIG. 6B is flow chart of the operational stage of the one-step voltage prediction, according to embodiments of the present disclosure;

FIG. 7A is flow chart of the training stage of the of the P-MSVP, according to embodiments of the present disclosure;

FIG. 7B is flow chart of the operational stage of the of the P-MSVP, according to embodiments of the present disclosure;

FIG. 8 is flow chart of the operational stage of the of the R-MSVP, according to embodiments of the present disclosure;

Figure 1A:
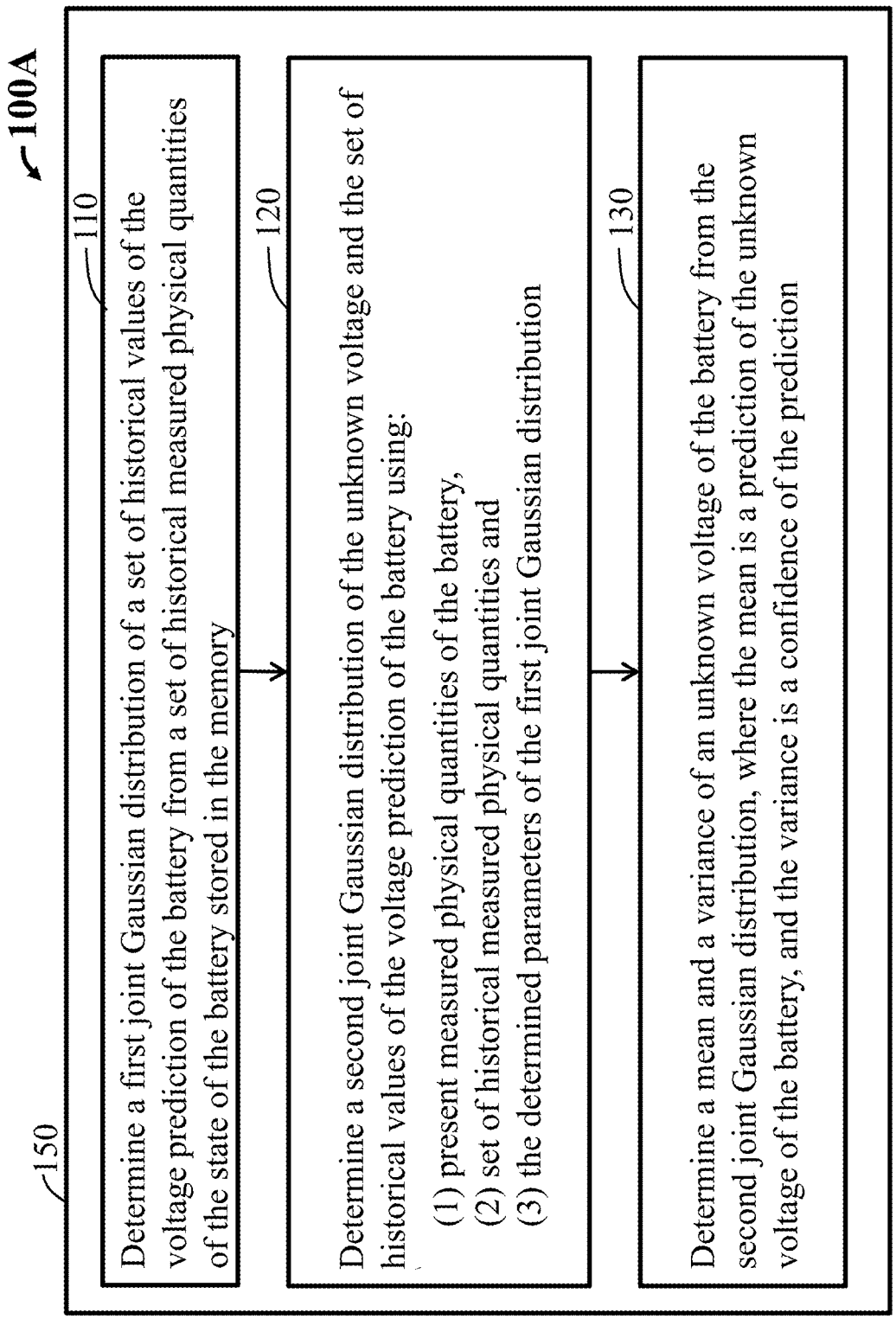
FIG. 1A is a block diagram of a method for predicting voltage of a battery while in communication with the battery, according to embodiments of the present disclosure.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims. Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Overview

Embodiments of the present disclosure provide for systems and methods for a data-driven battery State of Power (SoP) estimation of a battery. In particular, predicting battery voltage (current) corresponding to a given future current (voltage) demand, that is known to a battery management system (BMS) of a battery.

Embodiments of the present disclosure are based on recognition that predicting battery voltage can be more accurate using a data-driven method that directly predicts the battery voltage from the set of historical measured physical quantities of the battery, present measurements of the physical quantities, and future current profile.

Note, we understand that the SoP indicates how much power a battery can provide at a given time, and in combination with the SoH/SoC, can also be a metric to assess the battery's functionality. Whereas, the SoH and SoC can be used to quantify the state of a battery. Such that, the battery SoH can quantify the battery's maximum capacity, i.e., the amount of charge the battery can hold, with respect to the rated (nominal) capacity.

To that end, the present disclosure is founded on another realization that we could use two approaches belonging to a class of data-driven methods based on a Gaussian Process Regression (GPR) framework. For example, the GPR framework we found accurately models complicated battery dynamics using training data. Further, the setup using the GPR provides for easy access to the training data whenever the necessity for retraining arises, such as, due to battery aging, or considerable change in the outside temperature, or change in the resistance of the load, etc. We submit the approaches or algorithms of the present disclosure can address diverse battery operating conditions involving smooth and abruptly changing voltage/current measurements with both relatively small and large training datasets. For example, if the battery is charged and discharged with constant current, the current abruptly changes at time instants when the current value is changed from charging to discharging the battery. On the other hand, discharge current from the battery into load might smoothly vary in time. The first algorithm of the present disclosure is a Parallel Multi-Step Voltage Prediction (P-MSVP) that consists of multiple parallel one-step predictors acting upon appropriately down sampled measurements. The second algorithm of the present disclosure is a Recursive Multi-Step Voltage Prediction (R-MSVP) that comprises of a one-step predictor which performs multiple one step ahead voltage predictions recursively.

In addressing the problem of predicting battery voltage corresponding to a future current profile, assuming it is known and available to the BMS. We found the two algorithms (P-MSVP and R-MSVP) are particularly suited for a number of applications, for example, in uninterruptible power supply (UPS) systems, by non-limiting example. For instance, assume the present time is t, we propose that the two algorithms (P-MSVP and R-MSVP) predict voltage corresponding to future time t+T, assuming the current demand at t+T is known. Further, we proposed the two algorithms as data-driven, given that the true value of the quantity being estimated can be available immediately after the time period T, which enables a relatively easy access to the training data at any time of operation. Thus, the training data can be easily available when the utilized model of the present disclosure needs to be retrained, because of the battery aging or considerable change in the outside temperature, or change in the resistance of the load, etc, which is unlike in the data-driven and model-based SoH/SoC estimation. We proposed the two algorithms as data-driven for several reason, among many, because the models learned from data-driven methods according the present disclosure are able to more accurately fit the actual battery dynamics than conventional models. Moreover, the proposed data-driven algorithms of the present disclosure can be relatively easily cast to solve alternative problems of predicting the current corresponding to future voltage demand. Further, we note that once the voltage is predicted, the battery SoP can be given as a product between the predicted voltage and the current demand.

We also realized that Bayesian non-parametric approach is suitable for modeling highly complicated input-output relations with relatively small training datasets. Consequently, the proposed voltage prediction algorithms (P-MSVP and R-MSVP), based on the GPR framework, embody the Bayesian non-parametric approach. For example, the GPR models unknown quantity as a Gaussian distributed random variable whose predicted mean is a point estimate, while the predicted variance is used to quantify the uncertainty in the point estimate. This uncertainly quantification, which naturally follows from the GPR framework, is one of the GPR advantages over other methods, among many advantages.

Further, even though an essence of the problem of the present disclosure is to predict battery voltage corresponding to future current demand, we discovered we are also able to solve an equivalent problem, to predict current given the future voltage demand. For example, we assume the measurements of battery's physical quantities (such as voltage, current and temperature) up to the present time are available and utilized for voltage prediction. Such that, formally, the measurements of the voltage, current and temperature of a battery at discrete time t can be denoted, respectively, as $V_t$, $I_t$ and $T_t$. Wherein, the measurements can be taken with the sampling period $\_T$. The future current demand at M subsequent time instants $t+1; \ldots; t+M$, following the time instant t, is $I_{t+1}; \ldots; I_{t+M}$. Which leads us to our goal to predict voltage corresponding to the future current demand, i.e., to estimate $V_{t+1}; \ldots; V_{t+M}$ using the available data.

We contemplate that the present disclosure approaches to predicting battery voltage corresponding to future current demand, along with being able to predict current given the future voltage demand, may be applied to many technological fields. For example, the present disclosure may be applied to major energy storage components, including such applications as consumer electronics, residential rooftop solar photovoltaic systems, electric vehicles, smart grid systems and etc. Other applications of the present disclosure include a hybrid power supply system, a powertrain system for a hybrid electric vehicle. We also note the present disclosure may be applied to different types of batteries, including rechargeable batteries.

FIG. 1A is a block diagram of a method for predicting voltage of a battery while in communication with the battery, according to embodiments of the present disclosure. The method 100A of FIG. 1A is for predicting a voltage of a battery corresponding to at least one future current demand profile, while the battery is in communication with at least one processor 150. The method includes the step 110 of determining a first joint Gaussian distribution of a set of historical values of the voltage prediction of the battery from a set of historical measured physical quantities of the state of the battery stored in the memory The next step 120 of FIG. 1A can include determining a second joint Gaussian distribution of the unknown voltage and the set of historical values of the voltage prediction of the battery using present measured physical quantities of the battery, set of historical measured physical quantities and the determined parameters of the first joint Gaussian distribution The next step 130 of FIG. 1A may include determining a mean and a variance of a current voltage prediction of the battery from the second joint Gaussian distribution. Wherein the mean is an estimate of the current voltage prediction of the battery, and the variance is a confidence of the estimate. Wherein steps of the method are determined using the at least one processor and the memory.

Figure 1B:
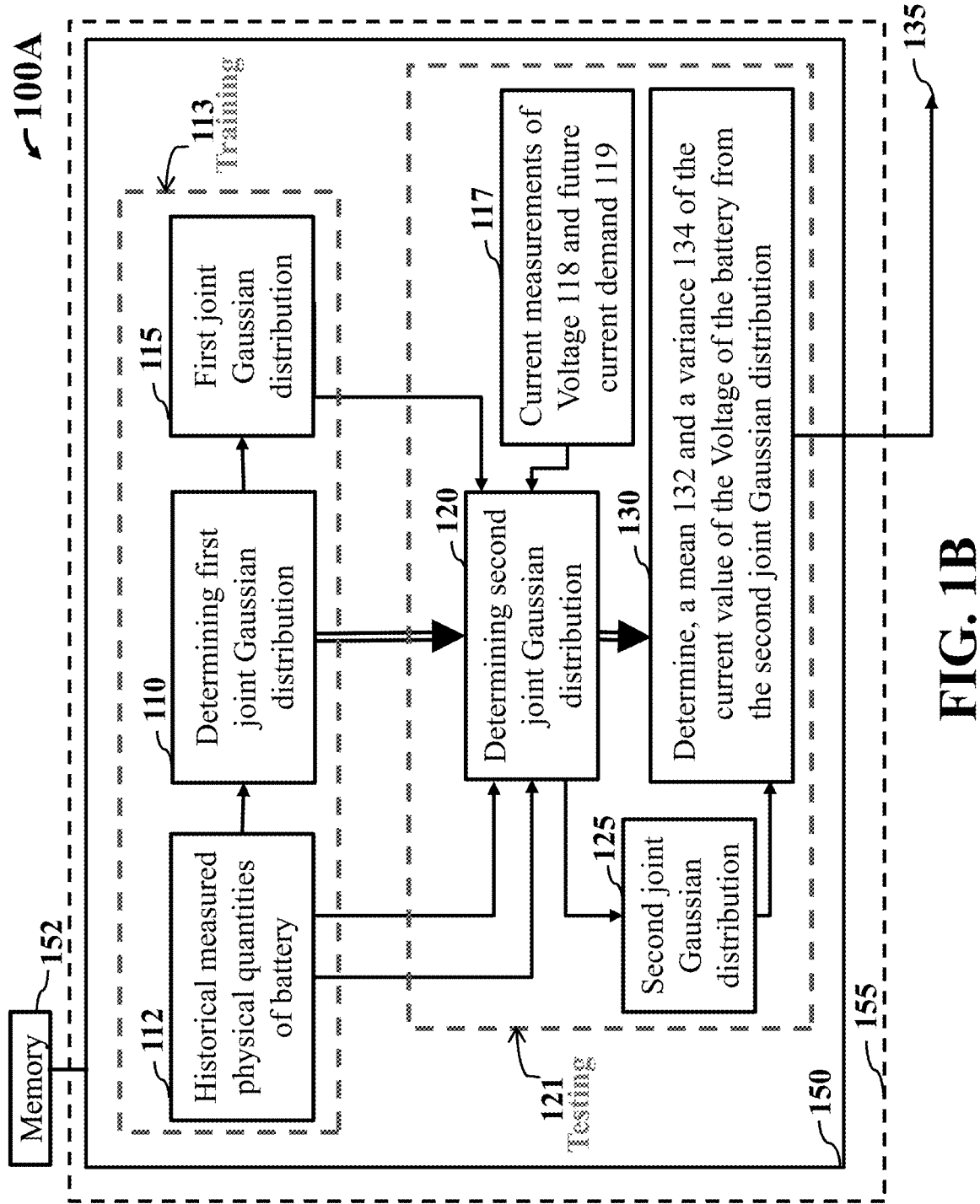
FIG. 1B is a block diagram of the method of FIG. 1A, illustrating some flow process steps of the method, according to embodiments of the present disclosure.

FIG. 1B is a block diagram of the method of FIG. 1A, illustrating some process flow steps of the method, according to embodiments of the present disclosure. The method 100A can be implemented using a processor 150 operatively connected to a memory 152 having stored therein information about data related to predicting voltage of the battery and operatively connected to outputs of sensors (not shown) measuring physical quantities of the battery. It is contemplated processor 150 can be optionally in communication with another processor, controller, battery management application 155 or the like. Further, the processor 150 may be used for calculating the voltage prediction of a battery, among other things, and may be integrated into a device, i.e. electric vehicle, in which the battery is used, or may be in communication with an external system. Processor 150 may alternatively be a component of a separate device, and may determine other aspects when the battery is inserted into this separate device and may be in communication with an electrical circuit. Information about the voltage prediction of the battery may be transmitted wirelessly or via hardwired from a separate device to the processor and from the processor to a display or the separate device. Further, processor 150 can be more than one processor, such that each processor may have at least one memory. It is contemplated that more than one processor may be in communication with another processor.

Still referring to FIG. 1B, the method 100A can be implemented using a battery management application 155 in communication with and/or running on the processor 150, and can implement and execute various battery management methods.

The method 100A of FIG. 1B includes a training stage 113 that can determine 110 a first joint Gaussian distribution 115 of a set of historical values of the voltage prediction of the battery from a set of historical measured physical quantities 112 of the state of the battery.

The method 100A of FIG. 1B includes a testing stage 121 that can determine 120 a second joint Gaussian distribution 125 of the unknown voltage and the set of historical values of the voltage prediction of the battery using the set of historical measured physical quantities 112 of the state of the battery, measured physical quantities of the battery at present time instant and future current demand 117, and the determined first joint Gaussian distribution 115.

Still referring to FIG. 1B, the second joint Gaussian distribution 125 of values of the voltage prediction of the battery is the probabilistic distribution of the values of the voltage prediction given present measurements 118 and future current demand 119 noted in box 117. In such a manner, the voltage prediction of the battery is determined probabilistically. For example, the method determines a mean 132 and a variance 134 of the current value of the voltage prediction of the battery from the second joint Gaussian distribution in box 130. Specifically, the mean 132 is an estimate of the unknown voltage of the battery, and the variance 134 is a confidence of the estimate. Both the mean 132 and variance 134 are outputted 135.

Figure 1C:
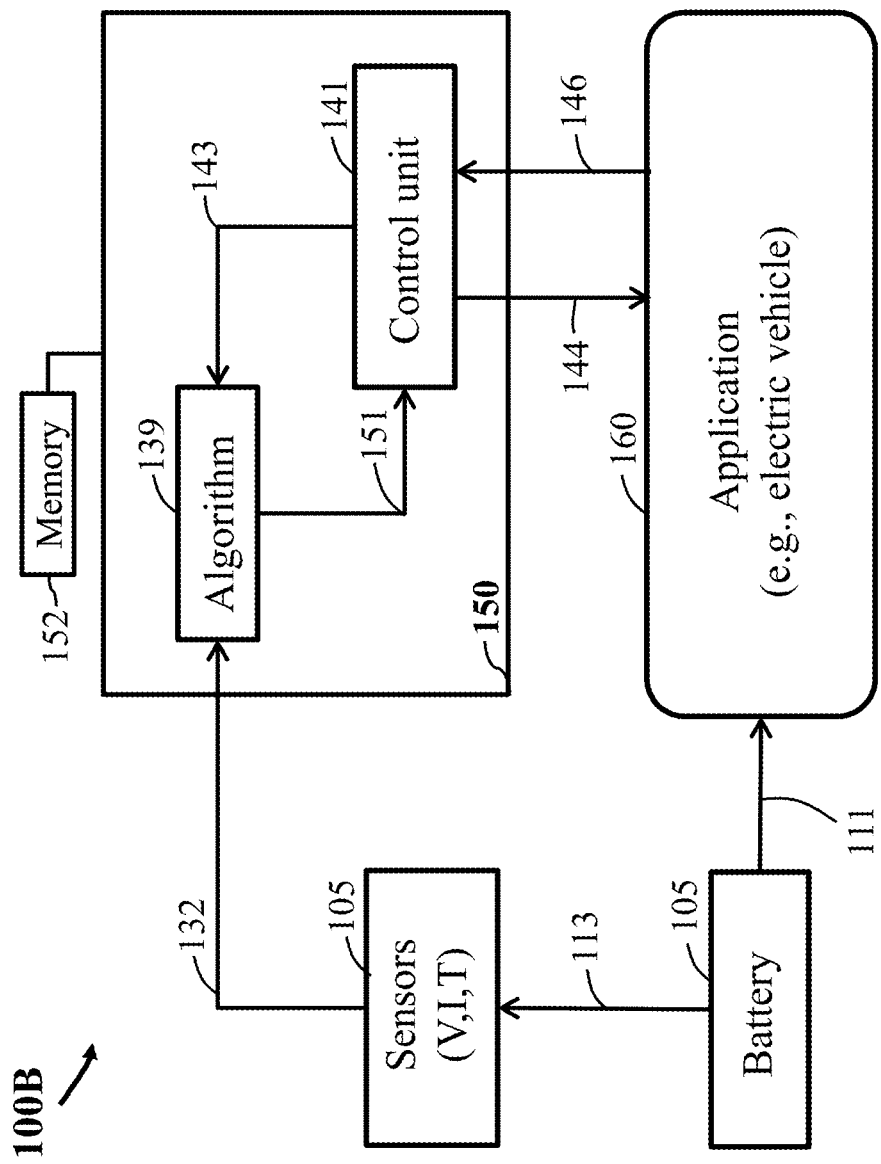
FIG. 1C is a block diagram of some components of a method for predicting voltage of a battery while in communication with the battery, according to embodiments of the present disclosure.

FIG. 1C is a block diagram of some components of an application of the method 100B for predicting voltage of a battery while in communication with the battery, according to embodiments of the present disclosure. For example, the battery 105 is in communication 111 with the application 160 such as an electric vehicle. Further, the battery 105 is in communication 113 with the sensors 107, and in further communication 132 with a processor 150. The processor can execute an algorithm 139 that may be stored in the memory 152. The algorithm 139 can be in communication 151 with the control unit 141, which can include a feedback 143 from the control unit 141 back to the algorithm 139. Further, the control unit 141 can be communication 144 with the application 160, along with a feedback 146 back to the control unit 146 from the application 160. It is contemplated the control unit 141 can be part of the processor 150 or in communication with the processor 150 positioned at some other location.

Figure 1D:
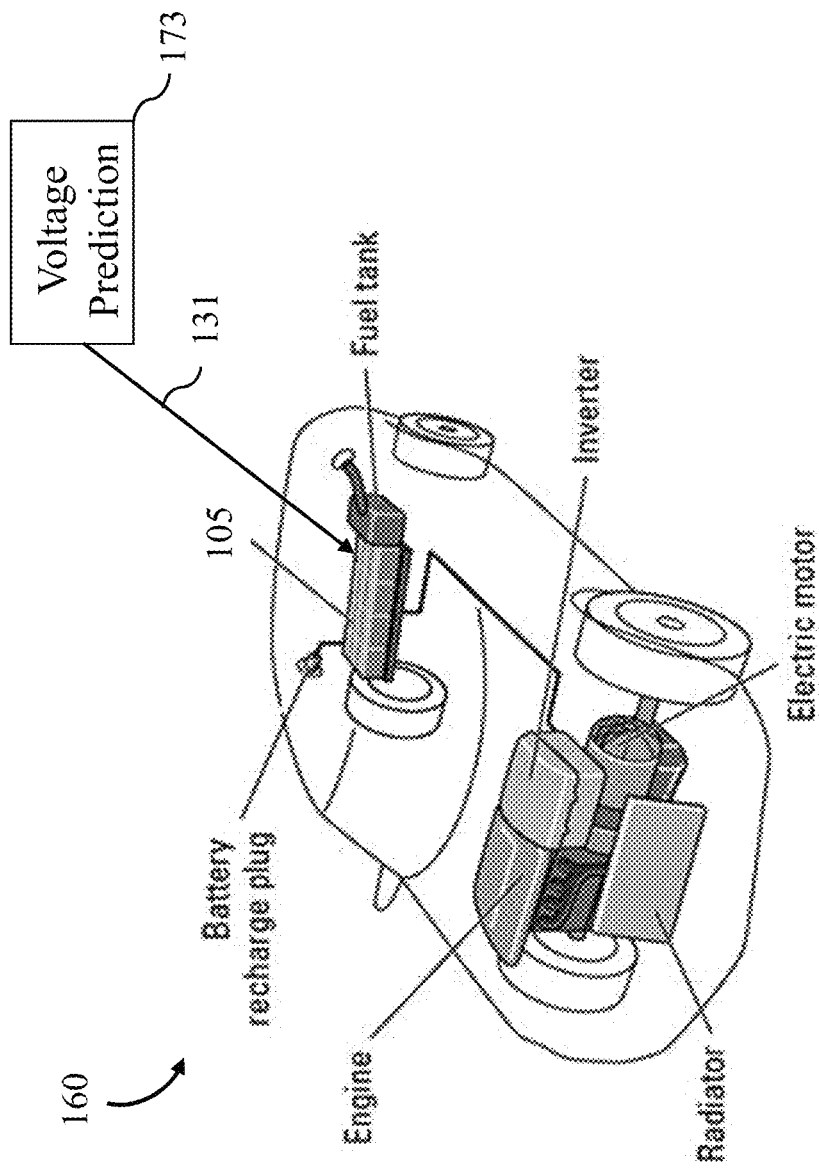
FIG. 1D illustrates an application of one embodiment for determining the voltage prediction for a battery powering an electric vehicle, according to embodiments of the present disclosure.

Referring to FIG. 1C and FIG. 1D shows an application 160 such as an electric vehicle of the method 100B that includes the electric vehicle that obtains electric power from a battery 105. The battery 105 can be a rechargeable battery and the like. FIG. 1C illustrates a set of sensors 107, connected 113 to the battery 105, measure a variety of physical quantities such as battery voltage, current, temperature, etc. The sensors 107 of FIG. 1C can be located approximate the battery in FIG. 1D. FIG. 1C shows the control unit 141 controlling the application 160 by sending control instructions 144 and receiving feedback/measurements 146. The control unit 141 of FIG. 1C can be located approximate the battery 105 of FIG. 1D, or some other location of the electric vehicle of FIG. 1D. The control unit 141 may need to know how much voltage a battery can provide for a given future current profile the application 160 may need for operation. Therefore, the control unit 141 can supply an algorithm 139 with the future current profile 143. Wherein the algorithm 139 takes as an input the sensor measurements 107 and the given future current profile, and predicts the corresponding voltage 151. The predicted voltage 151 is input to the control unit 141, wherein the control unit 141 can make necessary decisions.

FIG. 1D illustrates for example, some embodiments that allow a driver of the vehicle 160 to manage the battery system 100B to ensure enough power is available for operation at some period of time. In general, a separate device 173 of FIG. 1D, e.g., including the processor and memory, can be connected to the battery 105 and/or the sensors of the battery via connectors 131 (FIG. 1C) can perform the necessary measurements and estimates the voltage prediction. It is contemplated the separate device 173 of FIG. 1D can include a battery management application, among other things.

Figure 1E:
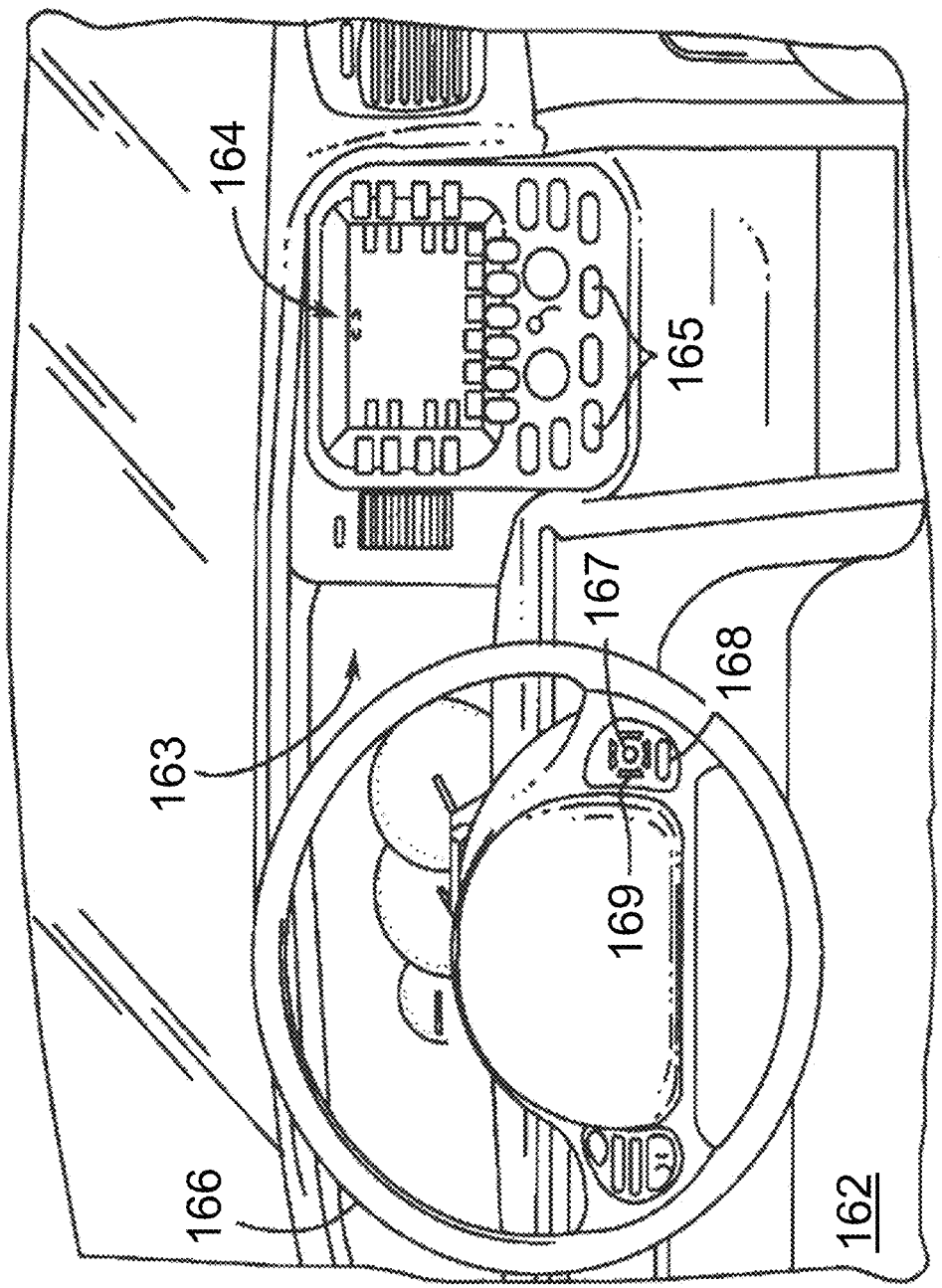
FIG. 1E is a schematic of an exemplar instrumental panel of the vehicle for displaying the estimated voltage prediction of the embodiment of FIG. 1D, according to embodiments of the present disclosure.

FIG. 1E shows an exemplar instrumental panel 162 of the electric vehicle 160. The instrumental panel 162 can include one or several displays 163 and 164 for displaying the results of the voltage prediction to the driver of the vehicle. The voltage prediction can be shown on the displays 163, 164 automatically or when the critical level of the voltage prediction is reached, or can be shown at some other specified level of voltage prediction. Additionally, or alternatively, the voltage prediction can be displayed on demand, e.g., via controls 165 and/or controls 167, 168 and/or 169 located on a steering wheel 166. It is contemplated the display maybe a wireless device separate from the instrumental panel 162, in communication with a wireless device, i.e. smart phone.

According to some embodiments of the disclosure, methods and systems are for predicting the voltage of the battery, while in communication with the battery. The term predicting voltage of the battery is understood as estimating future battery voltage corresponding to known future current demand of the load.

Figure 2:
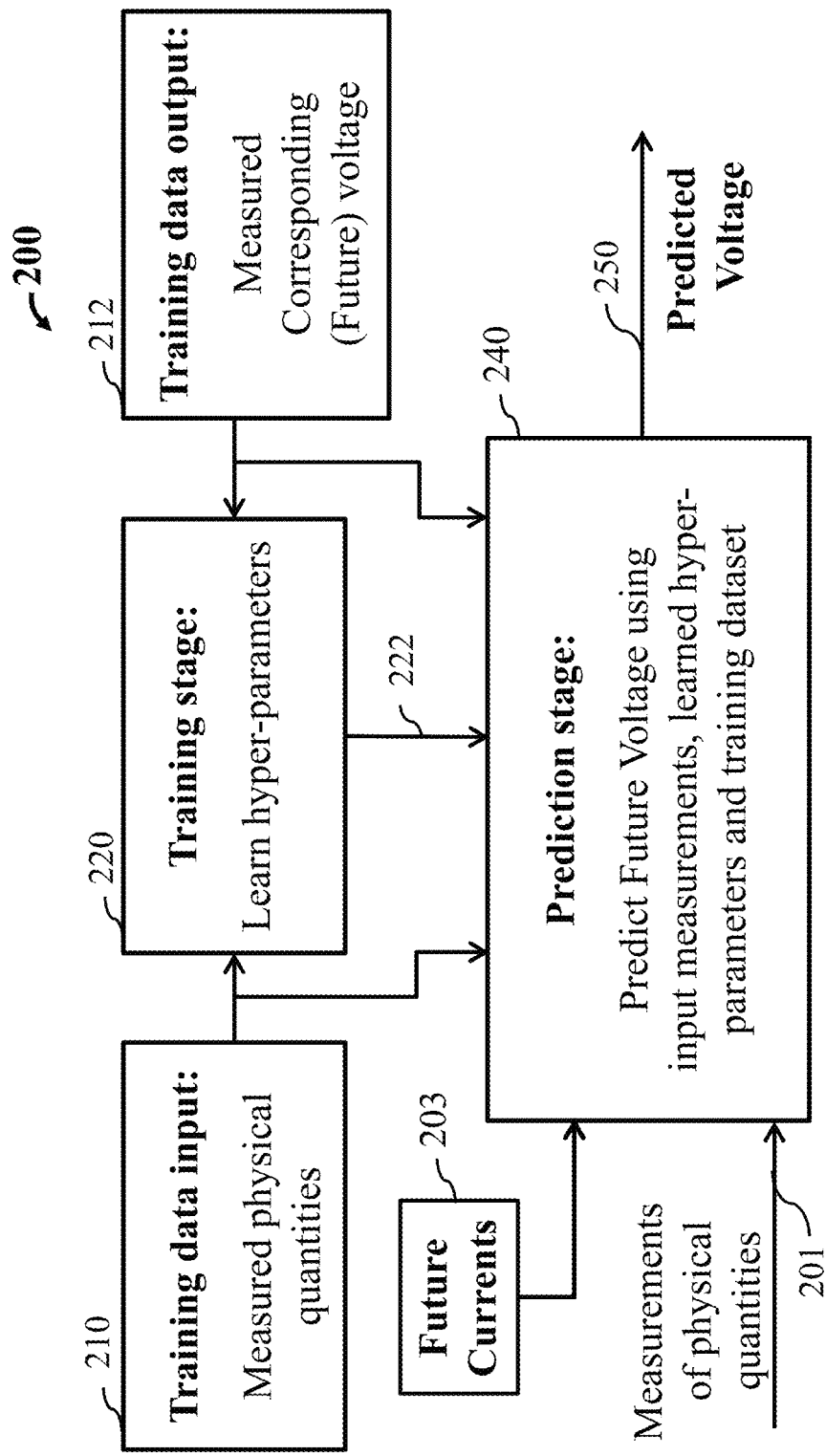
FIG. 2 is a block diagram illustrating training and prediction stage of the algorithms, according to embodiments of the present disclosure.

FIG. 2 is a block diagram illustrating training and prediction stage of the algorithms, according to embodiments of the present disclosure. FIG. 2 shows a block diagram of a multi-stage method 200 for battery voltage prediction according to one embodiment of the disclosure. The embodiment determines the voltage prediction in two stages, i.e., a training stage 220 and a prediction stage 240. It is contemplated when predicting battery voltage, the battery is in communication with at least one processor having a memory.

The method 200 of FIG. 2 uses measurements of physical quantities 201, which are obtained from measurement devices such as sensing devices coupled to an electronic circuit structure, attached to a battery of interest. The measured physical quantities 201 can include voltage, current and temperature of the battery of interest. Contemplated is the measured physical quantities 201 that may also include ambient temperature, volume of the battery, and gas leak measurement from the battery. Furthermore, the measured physical quantities may include measurements in the present as well as in previous time instants. More specifically, the input at time t can be measurements at time t, t-1, ..., t-T, for example.

Still referring to FIG. 2, training data is gathered and is used to infer mapping between physical quantities and the battery's future voltage corresponding to future current. For example, training data input 210 is retrieved from a memory of the processor. In particular, the training data input 210 is obtained offline, usually in a lab, and the measurements are taken by exposing a battery of the same type as the battery of interest, to a wide range of different temperatures, loads, etc. For example, the training data input 210 can be a collection of measurements of different physical quantities such as current, voltage, temperature, volume, etc., or some combination thereof, that is of the same type of battery as the battery of interest. Contemplated is the training data input 210 that may also include ambient temperature and gas leak measurement from the battery and also previous temporal values of the current, voltage and volume. The training data output 212 is the corresponding future voltage values where, the "future" is with respect to the time reference of the considered set of measurements from the training data. This was previously determined and saved in the memory of the processor.

The training stage 220, the processor offline utilizes the training data (training data input 210 and training data output 212), and performs training, in which, optimal hyper-parameters 222 are determined such that a chosen covariance function reasonably models the properties of the training data 210, 212; and wherein the optimized hyper-parameters 222 are stored in the memory.

Still referring to FIG. 2, at least one method in determining the optimized hyper-parameters 222 in the training stage 220, can include using a Gaussian Process Regression (GPR) framework, which is a probabilistic, nonparametric machine learning method, to accurately predict battery voltage. It is noted the term regression means can be an expression of an output variable of interest in terms of a function or a combination of functions of one or more input parameters.

FIG. 2 further illustrates prediction stage 240 according to embodiments of the disclosure. Unlike conventional methods which discard training data after the training stage, as noted above, the present disclosure further utilizes the training data 210, 220 in the prediction stage 240. For example, FIG. 2 shows the prediction stage 240 that takes inputs including: (1) training data input 210; (2) training data output 220; (3) the measurements of the physical quantities 201; (4) the determined hyper-parameters 222 evaluated in the training stage 220; and (5) future current demand 203, so that the estimation stage 240 outputs predicted voltage 250 corresponding to the future current demand.

Figure 3:
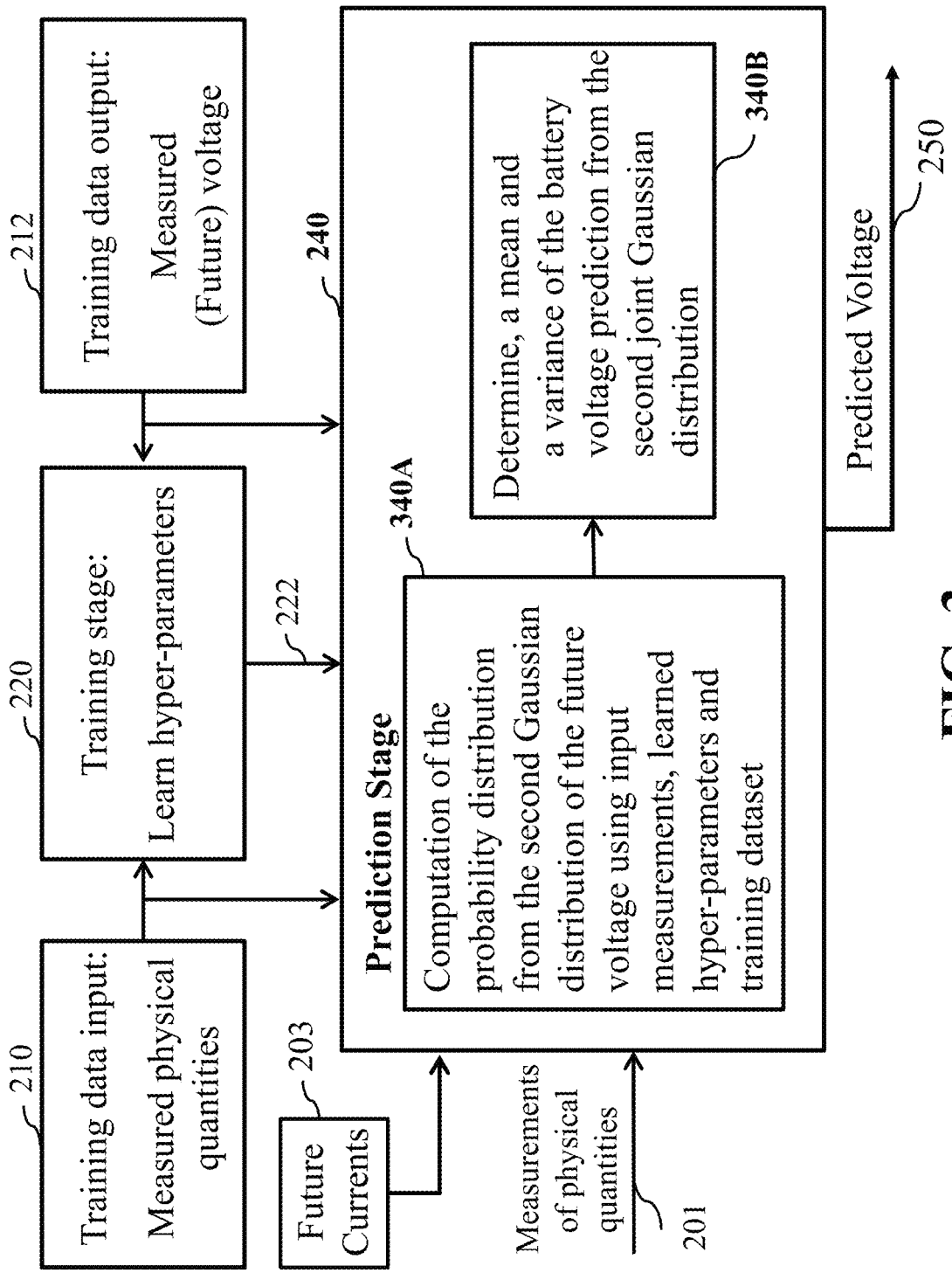
FIG. 3 is a block diagram illustrating details of the prediction stage of the algorithms of the method of FIG. 2, according to embodiments of the present disclosure.

FIG. 3 is a block diagram illustrating details of the prediction stage of the algorithms of FIG. 2, according to embodiments of the present disclosure. Referring to FIG. 3, the prediction stage 240 computes probability distribution of the voltage 340A corresponding to future current, based on the measurements of physical quantities, hyper-parameters learned in the training stage and, unlike conventional methods in the prior art, training dataset. Finally, determining 340B, a mean and a variance of the unknown battery voltage from the determined probability distribution 340A, wherein the mean is a point estimate of the unknown battery voltage, and the variance is a confidence of the point estimate, wherein steps of the method are determined using the at least one processor.

Figure 4:
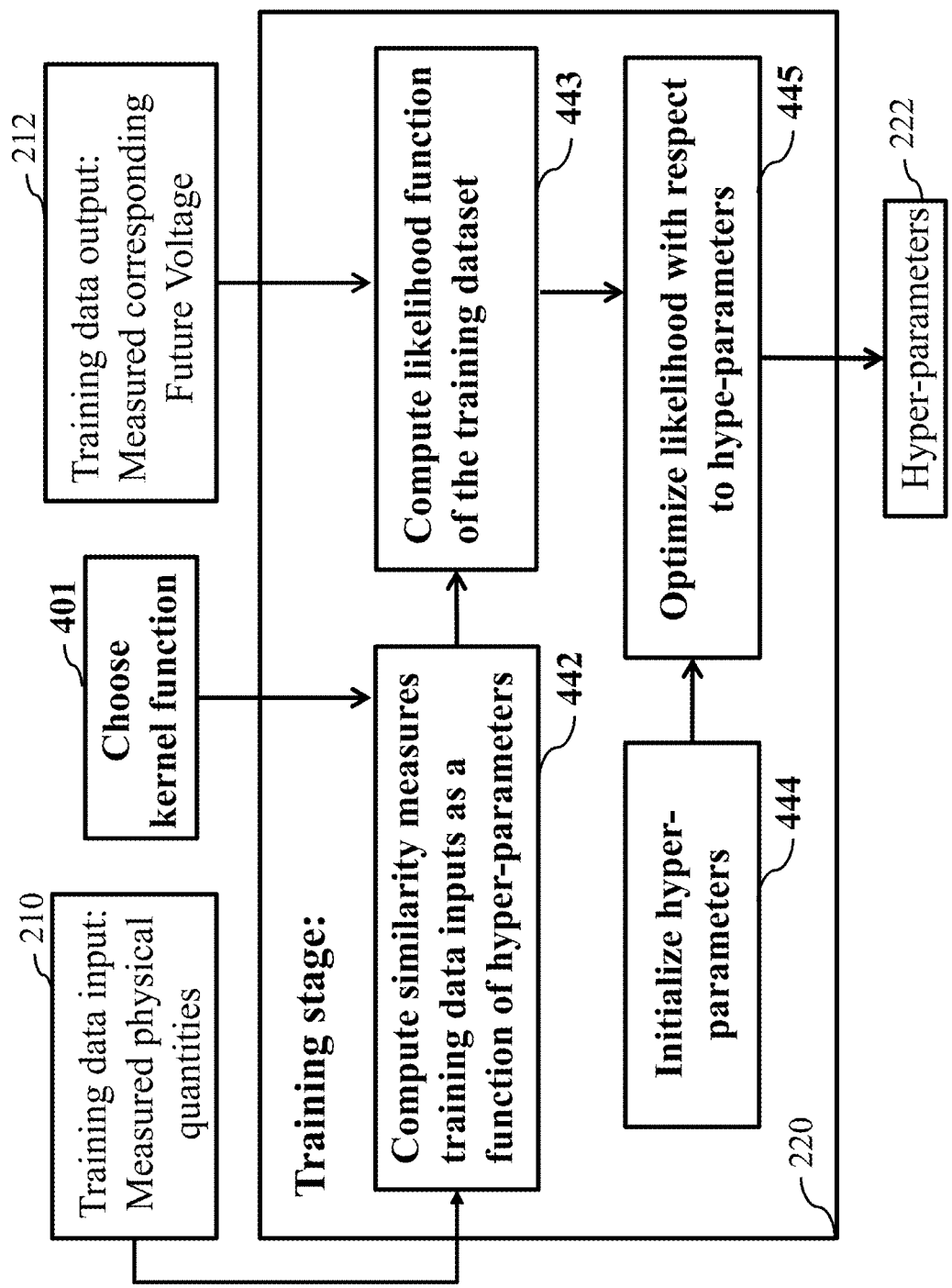
FIG. 4 is a block diagram illustrating processing steps embedded into the training stage of the voltage prediction of the method of FIG. 2, according to embodiments of the present disclosure.

FIG. 4 is a block diagram illustrating processing steps embedded into the training stage of the voltage prediction of FIG. 2, according to embodiments of the present disclosure. For example, FIG. 4 illustrates a block diagram of the training stage 220 in further detail of FIG. 2. The voltage prediction according to embodiments of the disclosure is tied to a kernel function 401 that the user needs to choose or design. One possible kernel function is a squared exponential (SE) kernel, defined below. The training data input 210 and selected kernel function 401 are inputs to 442 which computes similarities between pairs of measurements in the input training dataset 210. These similarity measurements are functions of hyper-parameters 222 to be determined. The similarity measures are then used to specify the likelihood function 443 of the training data output 212. A likelihood function of the training dataset is casted as an objective function in the optimization routine 445 which finds values of the hyper-parameters which maximize the likelihood of the training dataset. The optimization routine 445 is started with some initial values of the hyper-parameters 444 which may be completely random or selected according to a chosen kernel function. The outputs from the optimization algorithm 445 are values of the hyper-parameters.

Figure 5:
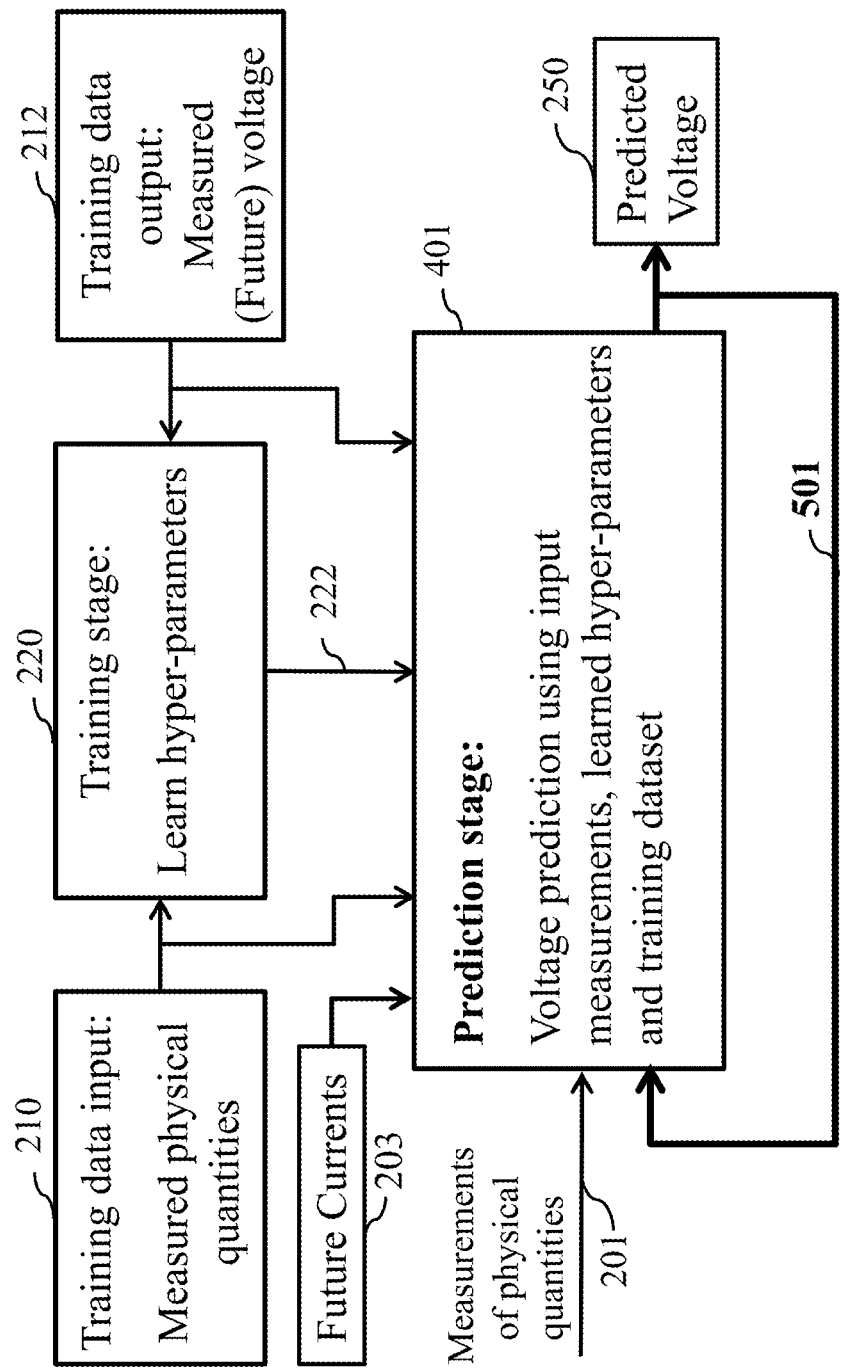
FIG. 5 is a block diagram illustrating a recursive multi-step voltage prediction (R-MSVP) algorithm of the method of FIG. 2, according to embodiments of the present disclosure.

FIG. 5 is a block diagram illustrating a recursive multi-step voltage prediction (R-MSVP) algorithm of the method of FIG. 2, according to embodiments of the present disclosure. Specifically, to predict voltage values corresponding to the future current demand at more than one future time instant, the voltage predictions at earlier time instants are fed back 501 and treated in the prediction stage 401 as measurements of physical quantities. The values that are fed back can be (1) only means or (2) both means and variances of the predicted voltages.

Description of Algorithms

The essence of the present disclosure is to predict battery voltage corresponding to future current demand, assuming it is known and available. An equivalent problem is to predict current given, the future voltage demand. We present methods for the former problem, but note they also can handle the latter problem as well.

We assume the measurements of battery's physical quantities (such as voltage, current and temperature) up to the present time are available and can be utilized for voltage prediction. Formally, the measurements of the voltage, current and temperature of a battery at discrete time t are denoted, respectively, $V_t$, $I_t$ and $T_t$. The measurements are taken with the sampling period $\Delta T$. The future current demand at M subsequent time instants t+1, ..., t+M, following the time instant t, is $I_{t+1}, \ldots, I_{t+M}$. Our goal is to predict voltage corresponding to the future current demand, i.e., to estimate $V_{t+1}, \ldots, V_{t+M}$ using the available data.

One-Step Voltage Prediction Algorithm

FIG. 6A is flow chart of the training stage of the one-step voltage prediction for Algorithm 1, according to embodiments of the present disclosure. For example, the one-step predictor for the training stage includes a simpler problem of predicting voltage corresponding to time t+1 from the measurements at times and the current demand corresponding to time t+1, $I_{t+1}$, is considered first. We refer to L as the memory size since it specifies the number of previous measurements used for voltage prediction.

The measurements and future current are collected in an input vector $x_t$, of length 3L+1, formatted as $$x_t = [I_{t+1} V_t I_t T_t \ldots V_{t-L} I_{t-L} T_{t-L}]^T. \tag{1}$$

Still referring to FIG. 6A, the output $y_t$ from the one-step voltage prediction algorithm is the voltage corresponding to time t+1, $$y_t = V_{t+1}. \tag{2}$$

The proposed prediction algorithms are based on the Gaussian process regression (GPR) framework. The crux of the method is in modeling the joint probability density function of N outputs $y_{t_1}, y_{t_2}, \ldots, y_{t_N}$ as the joint Gaussian probability density, $$P(y_{t_1}, y_{t_2}, \ldots, y_{t_N}) \sim N(0, \Sigma), \tag{3}$$

where the zero mean is assumed without loss of generality. The covariance matrix $\Sigma \in R^{N \times N}$ is given by $$[\Sigma]_{ij} = \kappa(x_{t_i}, x_{t_j}), \tag{4}$$

where $\kappa(x_{t_i}, x_{t_j})$ is the kernel function measuring statistical similarity between inputs $x_{t_i}$ and $x_{t_j}$. Intuitively, similar input vectors should yield similar outputs, i.e., voltage values.

Still referring to FIG. 6A, the selection of a kernel from a number of standard kernels available in the literature, is driven by the specifics of a particular problem. Conceptually, one ought to choose a kernel that captures the insights in how output depends on the input. In that sense, a problem specific kernel can be designed. Alternatively, one may choose a kernel from several different candidates which yields the best performance.

An example of a kernel function commonly used in the GPR framework is the squared exponential (SE) kernel, defined as $$\kappa_{SE}(x_{t_i}, x_{t_j}) = \sigma_v^2 \exp(-x_{t_i}^T D x_{t_j}), \tag{5}$$

where D is the diagonal matrix whose diagonal entries indicate the relevance of each entry in the input vector. Those entries, along with the kernel strength $\sigma_v^2$ are referred to as the hyper-parameters, collectively denoted H.

Still referring to FIG. 6A, the hyper-parameters are estimated from the training data. The training data D consists of N input-output pairs $(x_{t_i}, y_{t_i})$, where $i=1, \ldots, N$. The negative log-likelihood (NLL) function of the training data follows directly from the joint Gaussian distribution (3)

$$NLL(D, H) = \frac{1}{2}\text{logdet}\Sigma + \frac{1}{2}y^T \Sigma^{-1} y + \frac{N}{2}\log(2\pi), \tag{6}$$

where $y = [y_{t_1} \ y_{t_2} \ \ldots \ y_{t_N}]^T$ and the entries in $\Sigma$ are evaluated using (4) for hyper-parameters H. The maximum likelihood (ML) point estimate of the hyper-parameters is obtained as the argument which maximizes the NLL, $$\hat{H} = \underset{H}{\text{argmin}} NLL(D, H). \tag{7}$$

Operational Stage of the One-Step Voltage Prediction Algorithm

FIG. 6B is flow chart of the operational stage of the one-step voltage prediction for Algorithm 2, according to embodiments of the present disclosure. In particular, an optimization problem (7) can be solved using an optimization algorithm such as a gradient based method. We note that the gradient of the NLL (6) is given in a closed form for most available kernel functions. However, the NLL function is, in general, non-convex and the optimization (7) may therefore converge to a local minimum. To alleviate this issue, several optimization routines initialized differently may be run in parallel, and once all of them converge, the one resulting in the smallest NLL value yields the point estimate $\hat{H}$. As noted above, the flow chart of the training stage of the one-step voltage prediction is shown in FIG. 6A.

The estimated hyper-parameters $\hat{H}$ and training data D are used to infer the output $y_t$ corresponding to the input $x_t$ in the testing/operation stage. To do so, we first recall that the joint distribution of the training data outputs $y_{t_1}, \ldots, y_{t_N}$, and the target output $y_t$ is Gaussian, $$p(y_{t_1}, y_{t_2}, \ldots, y_{t_N}, y_t) \sim N(0, \Sigma'). \tag{8}$$

Still referring to FIG. 6B, the covariance matrix $\Sigma' \in R^{(N+1) \times (N+1)}$ is given by $$\Sigma' = \begin{bmatrix} \Sigma & \kappa \\ \kappa^T & \kappa_0 \end{bmatrix}. \tag{9}$$

Above, $\Sigma$ is the covariance matrix corresponding to the training data and obtained from (4), $\kappa \in R^{N \times 1}$ is the vector of kernel functions evaluated at each input $x_{t_i}$ from the training data D, and the test input $x_t$, $$[\kappa]_i = \kappa(x_{t_i}, x_t), i = 1, \ldots, N, \tag{10}$$

while $\kappa_0$ is given by $$\kappa_0 = \kappa(x_t, x_t). \tag{11}$$

Still referring to FIG. 6B, note that all kernels $\kappa$ in the covariance matrix $\Sigma'$ are evaluated using the estimated hyper-parameters $\hat{H}$, obtained in the training stage.

The unknown output $y_t$ is inferred from the joint distribution (8) by conditioning on the known training data outputs $y_{t_1}, \ldots, y_{t_N}$. Since the joint distribution is Gaussian, the conditional distribution is also Gaussian, $$p(y_t | y_{t_1}, \ldots, y_{t_N}) \sim N(\mu_t, \sigma_t^2), \tag{12}$$

where the mean $\mu_t$ and variance $\sigma_t^2$ are given by $$\mu_t = \kappa^T \Sigma^{-1} y \tag{13}$$

$$\sigma_t^2 = \kappa_0 - \kappa^T \Sigma^{-1} \kappa. \tag{14}$$

Still referring to FIG. 6B, the mean value of the inferred distribution is the point estimate of the predicted voltage, $$\hat{V}_{t+1} = \mu_t, \tag{15}$$

while the variance represents prediction uncertainly and can be used, for example, to specify the corresponding 95% confidence interval, $$[\mu_t - 1.96\sigma_t, \mu_t + 1.96\sigma_t]. \tag{16}$$

As noted above, the flow chart of the one-step voltage prediction in the operational stage is shown in FIG. 6B.

As a final remark, the extension of the presented development to the case of a non-zero mean vector in (3) is relatively straightforward. In the stationary case, the non-zero mean is estimated as the sample mean of the training data outputs. The estimated mean is then subtracted from the training data outputs and, upon performing all processing steps of the training and testing stage, added to (13) to yield the final voltage estimate.

Multi-Step Voltage Predictions

Parallel Multi-Step Voltage Prediction (P-MSVP)

FIG. 7A is a flow chart of the training stage of the P-MSVP, according to embodiments of the present disclosure. In particular, the P-MSVP consists of M parallel branches, indexed by $m = 1, \ldots, M$, where each branch m performs a separate m-step voltage prediction. Thus, the basic routine of the P-MSVP is the m-step voltage prediction, which is a generalization of the one-step voltage prediction, described in the previous part.

The input vector of the m-step voltage prediction routine at some discrete time t, $x_t^{(m)}$, is formatted by concatenating the future current demand at t+m, and the measurements of the voltage, current and temperature at t, t−m, . . . , t−mL, $$x_t^{(m)} = [I_{t+m} V_t^{(m)} I_t^{(m)} T_t^{(m)}]^T, \qquad (17)$$

where $$V_t^{(m)} = [V_t V_{t-m} \ldots V_{t-mL}]^T$$

$$I_t^{(m)} = [I_t I_{t-m} \ldots I_{t-mL}]^T$$

$$T_t^{(m)} = [T_t T_{t-m} \ldots T_{t-mL}]^T$$

The target output is the voltage corresponding to time t+m, $$y_t^{(m)} = V_{t+m}. \qquad (18)$$

Still referring to FIG. 7A, the training stage of the m-step voltage prediction routine learns the hyper-parameters $H^{(m)}$ corresponding to the utilized kernel function by minimizing the negative log-likelihood (NLL) of the training data outputs, where the training data $D^{(m)}$ consists of $N^{(m)}$ input-output pairs, $(x_{t_i}^{(m)}, y_{t_i}^{(m)})$, i=1, . . . , $N^{(m)}$.

FIG. 7B is flow chart of the operational stage of the of the P-MSVP, according to embodiments of the present disclosure. In the testing/operational stage, the mean $\mu_t^{(m)}$ and variance $\sigma_t^{2(m)}$ of the inferred Gaussian distribution of the voltage corresponding to the future current $I_{t+m}$ are evaluated following the procedure described in One-step Voltage Prediction. The flow charts of the training and operational stages are shown in FIGS. 7A and 7B, respectively. Note that the for loops in the flow charts are executed in parallel.

Recursive Multi-Step Voltage Prediction (R-MSVP)

The training stage of the R-MSVP is the same as for the one-step voltage prediction. Thus, FIG. 6A is also a flow chart of the training stage of the R-MSVP, according to embodiments of the present disclosure.

FIG. 8 is flow chart of the operational stage of the of the R-MSVP, according to embodiments of the present disclosure. In particular, the main idea behind the R-MSVP is to treat the predicted voltage corresponding to a certain time instant t+m as the measured voltage when predicting the voltage corresponding to the following time instant t+m+1. More precisely, at some time instant t, the one-step voltage prediction yields $\mu_t^{(1)}$, evaluated using (13). To predict voltage corresponding to t+2, the point estimate of the predicted voltage corresponding to t+1, $\mu_t^{(1)}$, is treated as the measured voltage and used along with the measurements of the voltage, current and temperature at time instants t, t−1, . . . , t−L, as well as future current demands $I_{t+1}$ and $I_{t+2}$ in a one-step prediction algorithm to obtain $\mu_t^{(2)}$. The process continues in this spirit until all M voltage predictions are obtained.

Still referring to FIG. 8, the basic routine of the R-MSVP is the one-step prediction algorithm. The training stage of the R-MSVP algorithm is the same as in One-step voltage prediction. and consists of learning the hyper-parameters of the kernel function by minimizing the negative log-likelihood of the training data D, consisting of N input-output pairs $(x_{t_i}, y_{t_i})$, i=1, . . . , N. The estimated hyper-parameters are used for voltage prediction over the whole prediction time horizon.

In the testing/operational stage for FIG. 8, the R-MSVP at time t serially predicts voltages corresponding to t+1, . . . , t+M. The voltage corresponding to time instant t+m is predicted using the one-step prediction algorithm where the input is formatted as $$x_t^{(m)} = [I_{t+m} V_t^{(m)} I_t^{(m)} T_t]^T, \qquad (19)$$

with $$V_t^{(m)} = [\mu_t^{(m-1)} \ldots \mu_t^{(1)} V_t \ldots V_{t-L+m-1}]^T$$

$$I_t^{(m)} = [I_{t+m-1} \ldots I_{t+1} I_t \ldots I_{t-L+m-1}]^T$$

$$T_t = [T_t T_{t-1} \ldots T_{t-L}]^T$$

and where $\mu_t^{(p)}$ is the mean of the inferred Gaussian distribution of the predicted voltage corresponding to t+p. Note that the formatting in (19) holds when L>m while the case when L≤m is handled in an analogous manner.

As noted above, the flow chart of the training stage of the R-MSVP is shown in FIG. 6A, and the operational stage of the R-MSVP is shown in FIG. 8. Note that the flow chart of the training stage of the R-MSVP, is the same as for the one-step prediction, shown in FIG. 6A.

Online Retraining

Both proposed algorithms, whose flowcharts are shown in FIG. 6A. and FIG. 6B. require training data to learn hyper-parameters of the utilized kernel function. However, the battery model changes due to aging and the hyper-parameters should be re-estimated after a certain time period. While this restriction poses significant challenges in the data-driven SoC and SoH estimation, this is not so of an issue in the battery voltage prediction. Namely, the current, voltage and temperature of a battery are continuously being measured and thus the training data is immediately available as soon as the voltage prediction error (also easily available) starts indicating that the need for retraining has arisen.

Enhancements

At least one main disadvantage of the P-MSVP algorithm of FIG. 7A and FIG. 7B, can be that its each parallel branch effectively downsamples the incoming measurements, possibly introducing aliasing, which detrimentally impacts the performance. Therefore, this particular method may not be suitable for the scenarios where voltage and current exhibit abrupt changes. At least one approach to alleviate this issue can be to incorporate anti-aliasing filtering in each parallel branch.

On the other hand, the R-MSVP of FIG. 8 can handle data with abrupt changes as long as the sampling period $\Delta T$ of the measurement system is appropriately selected. However, the R-MSVP of FIG. 8 relies on voltage predictions corresponding to t+1, . . . , t+m to predict voltage for t+m+1, implying that the estimation error may accumulate over the prediction time horizon. A possible way to overcome this problem can be to feed back not only the predicted mean $\mu_t$, but also the predicted variance. In other words, both mean and variance of the predicted Gaussian distribution can be fed back. Then, a certain number of samples are taken from the predicted Gaussian distribution to better represent the predicted voltage. Those samples are then treated as separate measurements for the prediction in the following time instant.

Computational Complexity

The computational complexity of the one-step voltage prediction in the operational stage of FIG. 6B can be assessed from (13) and (14) noting that the mean $\mu_t$ is given as a linear combination of the training data outputs, with the coefficients given by the vector-matrix product $\kappa^T \Sigma^{-1}$. Assuming the covariance matrix of the training data, $\Sigma$, is inverted at the end of the training stage, the computational complexity of the one-step voltage predictor is $O(N^2)$ and $O(N^3)$ per prediction of mean and variance, respectively.

Since both P-MSVP of FIGS. 7A and 7B, and R-MSVP of FIGS. 6A and 8, perform M one-step voltage predictions at any time instant t, the overall computational complexity of predicting voltage means in the operational stage of either algorithm is $O(MN^2)$. On the other hand, while R-MSVP of FIGS. 6A and 8, relies on a single one-step predictor, the P-MSVP of FIGS. 7A and 7B, employ M separate one-step predictors. This implies that training of the P-MSVP of FIG. 7A is M times more computationally demanding than training the R-MSVP OF FIG. 8A.

While the P-MSVP of FIG. 7B and R-MSVP of FIG. 8 have the same computational complexity in the operational stage, the computational times needed to output all M voltage predictions are different because the former admits parallel implementation, while the later performs predictions serially. This implies that the P-MSVP of FIG. 7B is M times faster than the R-MSVP of FIG. 8.

Other aspects of the present disclosure may further comprise using a sparse learning module for at least one step in estimating the voltage prediction of a battery to reduce an amount of the historical data.

Instead of using all training dataset as in the one-step prediction GPR, an appropriately selected subset of training data points, called inducing points can be used for training. Therefore, the proposed method significantly reduces the computational complexity when the size of the training dataset exceeds a few thousand. This technique is known as sparse GPR. There are a variety of sparse GPR algorithms in the literature and we here outline principles of one of them.

To keep notation simpler, we denote with $f_*$ the unknown voltage and with f the collection of all voltage values from the training dataset. Also, the measurements at the present time instant are denoted with $x_*$, while the input measurements from the training dataset are denoted with X.

The computational cost of a regular GPR is reduced by introducing m inducing variables and modifying the joint prior distribution, $p(f_*, f)$. Let $u=[u_1, \ldots, u_m]^T$ denote the inducing variables which correspond to a set of input locations $X_u$ called inducing points. The inducing points are chosen as a subset of the data points. Given the inducing points, the joint prior distribution, $p(f_*,f)$ can be rewritten as $$p(f_*,f) = \int p(f_*,f|u)p(u)du, \quad (19)$$

where $p(u) = N(0, K_{u,u})$. It is assumed that $f_*$ and f are conditionally independent given u for the approximation of $p(f_*,f)$ in the following $$p(f_*,f) \approx q(f_*,f) = \int q(f_*|u)q(f|u)p(u)du. \quad (20)$$

Subsequently, it is assumed that the training conditional $q(f|u)$ is fully independent and the test conditional remains exact as $$q(f|u) = \prod_{n=1}^{N} p(f_n|u) \quad (21)$$
$$= N(K_{f,u}K_{u,u}^{-1}u, \, diag[K_{f,f} - Q_{f,f}]),$$

$$q(f_*|u) = p(f_*|u), \quad (22)$$

where diag[A] denotes the diagonal matrix in which all of the diagonal elements equal the corresponding elements of A and other elements are zero. By inserting above distributions into (2) and integrating over u, the joint prior is given by $$q(f, f_*) = N\left(0, \begin{bmatrix} Q_{f,f} - diag[Q_{f,f} - K_{f,f}] & Q_{f,*} \\ Q_{*,f} & K_{*,*} \end{bmatrix}\right) \quad (23)$$

where $Q_{a,b}=K_{a,u}K_{u,u}^{-1}K_{u,b}$ is a low-rank matrix (i.e., rank m). Using the above joint prior distribution, the predictive distribution is obtained as $$q(y_*|X,y,x_*,\Theta) = N(\tilde{\mu}_*, \tilde{\Sigma}_*) \quad (24)$$

where $$\tilde{\mu}_* = K_{*,u}\Omega K_{u,f}\Lambda^{-1}y \quad (25)$$

$$\tilde{\Sigma}_* = \sigma_n^2 + K_{*,*} - Q_{*,*} + K_{*,u}\Omega K_{u,*}. \quad (26)$$

Above, $\Omega=(K_{u,u}+K_{u,f}\Lambda^{-1}K_{f,u})^{-1}$ and $\Lambda=diag[K_{f,f}-Q_{f,f}+\sigma_n^2 I]$. It is seen that the only matrix requiring inversion is the N×N diagonal matrix $\Lambda$, which yields a significant reduction in computational complexity. The computational cost of training a one-step predictor becomes $O(Nm)$ that is linear in N and a larger m leads to better accuracy at the expense of increased computational requirements. Also, testing time complexity is $O(m)$ and $O(m^2)$ for calculating the mean and the variance, respectively.

Features

The present disclosure may include the set of historical measured physical quantities of the state of the battery having one of, a current, a voltage, a temperature or some combination thereof, at one or more consecutive time instants. Further, the predicted mean and variance of the unknown voltage of the battery can be determined using a feedback of at least one previously determined one of means, variance, or both, of the unknown voltage prediction. Further still, the present measured physical quantities of the battery can be obtained from measurement devices such as sensing devices coupled to an electronic circuit structure, attached to a battery supply.

Another feature may include determining the first joint Gaussian distribution by determining a distribution, of the set of historical values of the voltage prediction of the battery by identifying a statistical distance between each historical measured value and at least one historical measured value from the set of historical values of the voltage prediction of the battery based on parameters of the first joint Gaussian distribution. Wherein the parameters of the first joint Gaussian distribution are determined by maximizing the first joint Gaussian distribution of the set of historical values of the voltage prediction of the battery using an optimization algorithm.

Still another aspect can include determining the second joint Gaussian distribution of the unknown voltage and the set of historical values of the voltage prediction of the battery by identifying a statistical distance between the present measured physical quantities of the battery and the historical measured physical quantities based on the determined parameters of the first joint Gaussian distribution.

It is possible for determining the mean and the variance of the unknown voltage of the battery from the second joint Gaussian distribution by evaluating a probability distribution of the unknown voltage from the second joint Gaussian distribution. Wherein, evaluating the probability distribution of the unknown voltage from the second joint Gaussian distribution can include determining a probability distribution of only unknown voltage.

Other aspects of the present disclosure may further comprise using a sparse learning module for at least one step in estimating the voltage prediction of a battery to reduce an amount of the historical data.

Further, aspects may include the set of historical measured physical quantities of the state of the battery include one of, an ambient temperature, a volume and a gas leak measurement from the battery, aging of the battery, leakage of current over time of the battery, error rate of the measured physical quantities of the state of the battery and other related error related data.

Aspects can also further comprise predicting an another unknown voltage of the battery corresponding to a future current demand at an another time instant using a feedback of at least one previously determined predicted mean of the unknown voltage of the battery. Further, the present disclosure may further comprise predicting an another unknown voltage of the battery corresponding to a future current demand at an another time instant using a feedback of at least one previously determined predicted mean and variance of the unknown voltage of the battery.

Aspects of the present disclosure also include the parameters of the first joint Gaussian distribution of the set of historical values of the voltage prediction of the battery are determined by maximizing the first joint Gaussian distribution of the set of historical values of the voltage prediction of the battery using an optimization algorithm. Further, other aspects can include the second joint Gaussian distribution of the unknown voltage and the set of historical values of the voltage prediction of the battery from the present measured physical quantities of the battery can be determined by identifying a statistical distance between the present measured physical quantities of the battery and the historical measured physical quantities based on the determined parameters of the first joint Gaussian distribution.

Further aspects can include the system having one of at least one sensor, outputs of sensors measuring physical quantities of the battery, an inertial measurement unit, a transceiver, at least one display operatively coupled to other components through connections, or some combination thereof.

Figure 9:
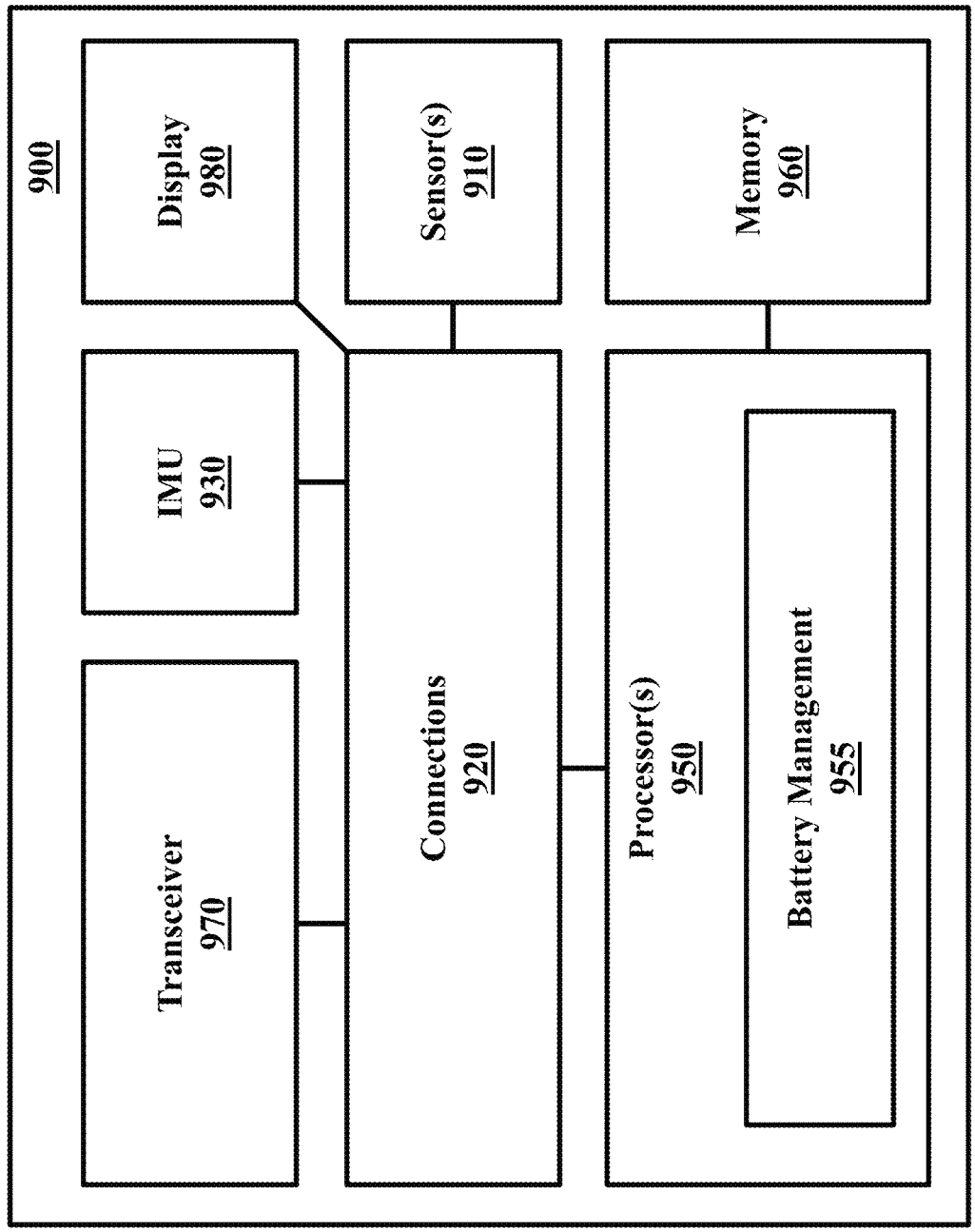
FIG. 9 illustrates a block diagram of at least one system configured for determining the voltage prediction of the battery, according to some embodiments of the disclosure.

FIG. 9 shows a block diagram of an exemplary system 900 configured for predicting the unknown voltage of the battery according to some embodiments of the disclosure. The system 900 can be implemented integral with the battery or machinery having the battery. Additionally, or alternatively, the system 900 can be communicatively connected to the sensors measuring physical quantities of the battery.

The system 900 can include one or combination of sensors 910, an inertial measurement unit (IMU) 930, a processor 950, a memory 960, a transceiver 970, and a display/screen 980, which can be operatively coupled to other components through connections 920. The connections 920 can comprise buses, lines, fibers, links or combination thereof.

The transceiver 970 can, for example, include a transmitter enabled to transmit one or more signals over one or more types of wireless communication networks and a receiver to receive one or more signals transmitted over the one or more types of wireless communication networks. The transceiver 970 can permit communication with wireless networks based on a variety of technologies such as, but not limited to, femtocells, Wi-Fi networks or Wireless Local Area Networks (WLANs), which may be based on the IEEE 802.11 family of standards, Wireless Personal Area Networks (WPANS) such Bluetooth, Near Field Communication (NFC), networks based on the IEEE 802.15x family of standards, and/or Wireless Wide Area Networks (WWANs) such as LTE, WiMAX, etc. The system 900 can also include one or more ports for communicating over wired networks.

In some embodiments, the system 900 can comprise sensors for measuring physical quantities of the battery, which are hereinafter referred to as "sensor 910". For example, the sensor 910 can include a voltmeter for measuring voltage of the battery, an ammeter for measuring current of the battery, and a thermometer for measuring temperature of the battery.

The system 900 can also include a screen or display 980 rendering information about the predicted unknown voltage of the battery. In some embodiments, the display 980 can also be used to display measurements from the sensor 910. In some embodiments, the display 980 can include and/or be housed with a touchscreen to permit users to input data via some combination of virtual keyboards, icons, menus, or other GUIs, user gestures and/or input devices such as styli and other writing implements. In some embodiments, the display 980 can be implemented using a liquid crystal display (LCD) display or a light emitting diode (LED) display, such as an organic LED (OLED) display. In other embodiments, the display 980 can be a wearable display.

In some embodiments, the result of the fusion can be rendered on the display 980 or submitted to different applications that can be internal or external to the system 900. For example, a battery management application 955 running on the processor 950 can implement and execute various battery management methods.

Exemplary system 900 can also be modified in various ways in a manner consistent with the disclosure, such as, by adding, combining, or omitting one or more of the functional blocks shown. For example, in some configurations, the system 900 does not include the IMU 930 or the transceiver 970.

The processor 950 can be implemented using a combination of hardware, firmware, and software. The processor 950 can represent one or more circuits configurable to perform at least a portion of a computing procedure or process related to sensor fusion and/or methods for further processing the fused measurements. The processor 950 retrieves instructions and/or data from memory 960. The processor 950 can be implemented using one or more application specific integrated circuits (ASICs), central and/or graphical processing units (CPUs and/or GPUs), digital signal processors (DSPs), digital signal processing devices (DSPDs), programmable logic devices (PLDs), field programmable gate arrays (FPGAs), controllers, micro-controllers, microprocessors, embedded processor cores, electronic devices, other electronic units designed to perform the functions described herein, or a combination thereof.

The memory 960 can be implemented within the processor 950 and/or external to the processor 950. As used herein the term "memory" refers to any type of long term, short term, volatile, nonvolatile, or other memory and is not to be limited to any particular type of memory or number of memories, or type of physical media upon which memory is stored. In some embodiments, the memory 960 holds program codes that facilitate prediction of the unknown voltage of the battery, and other tasks performed by the processor 950.

In general, the memory 960 can represent any data storage mechanism. The memory 960 can include, for example, a primary memory and/or a secondary memory. The primary memory can include, for example, a random access memory, read only memory, etc. While illustrated in FIG. 9 as being separate from the processors 950, it should be understood that all or part of a primary memory can be provided within or otherwise co-located and/or coupled to the processors 950.

Secondary memory can include, for example, the same or similar type of memory as primary memory and/or one or more data storage devices or systems, such as, for example, flash/USB memory drives, memory card drives, disk drives, optical disc drives, tape drives, solid state drives, hybrid drives etc. In certain implementations, secondary memory can be operatively receptive of, or otherwise configurable to a non-transitory computer-readable medium in a removable media drive (not shown). In some embodiments, the non-transitory computer readable medium forms part of the memory 960 and/or the processor 950.

Figure 10:
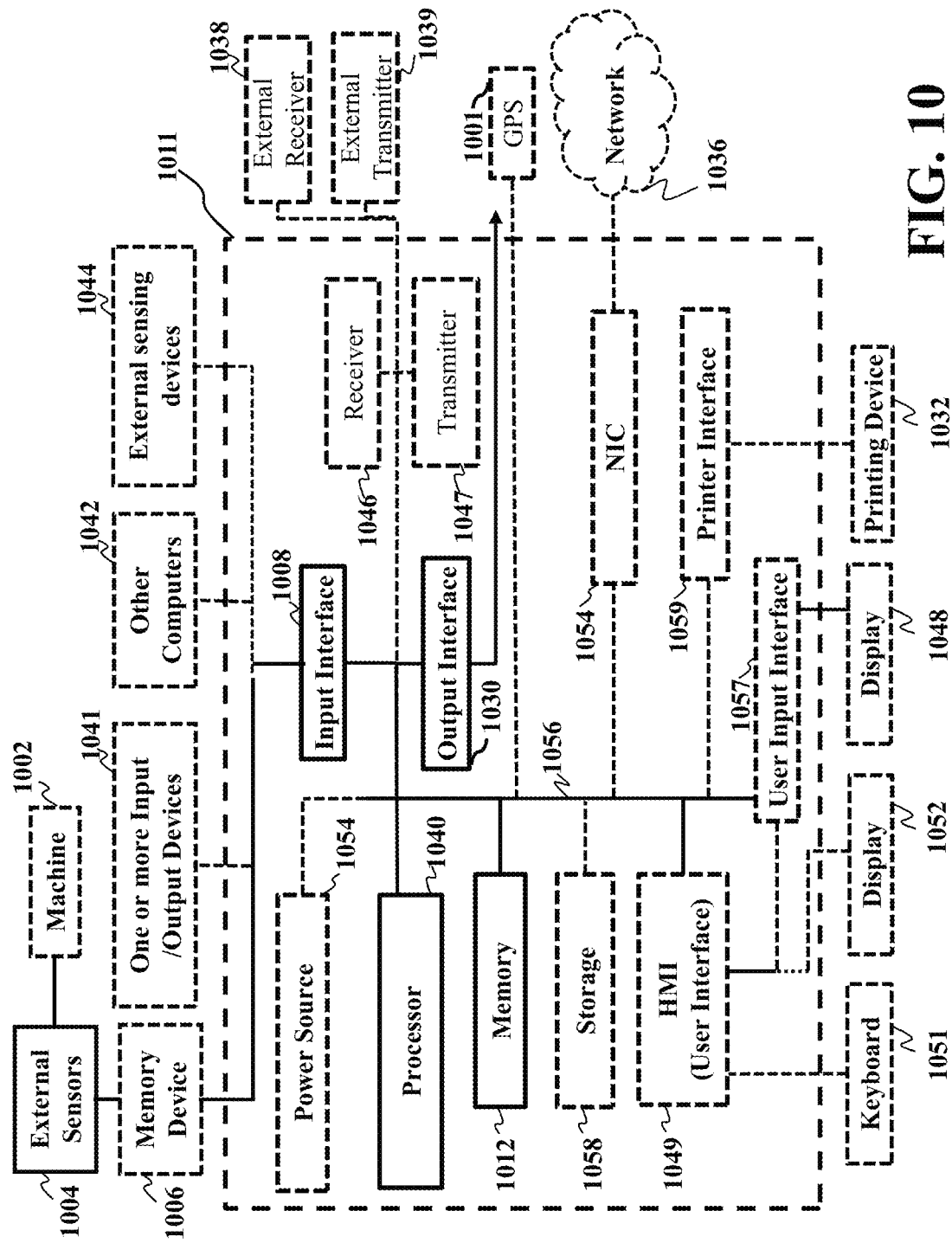
FIG. 10 is a block diagram of illustrating the method of FIG. 1A, that can be implemented using an alternate computer or processor, according to embodiments of the present disclosure.

FIG. 10 is a block diagram of illustrating the method of FIG. 1A, that can be implemented using an alternate computer or processor, according to embodiments of the present disclosure. A computer/controller and the like 1011 can include or be in communication with a processor 1040, computer readable memory 1012, storage 1058 and user interface 1049 with display 1052 and keyboard 1051, which are connected through bus 1056. For example, the user interface 1049 in communication with the processor 1040 and the computer readable memory 1012, acquires and stores the data in the computer readable memory 1012 upon receiving an input from a surface, keyboard surface, of the user interface 1057 by a user.

Contemplated is that the memory 1012 can store instructions that are executable by the processor, historical data, and any data to that can be utilized by the methods and systems of the present disclosure. The processor 1040 can be a single core processor, a multi-core processor, a computing cluster, or any number of other configurations. The processor 1040 can be connected through a bus 1056 to one or more input and output devices. The memory 1012 can include random access memory (RAM), read only memory (ROM), flash memory, or any other suitable memory systems.

Still referring to FIG. 10, a storage device 1058 can be adapted to store supplementary data and/or software modules used by the processor. For example, the storage device 1058 can store historical data and other related data as mentioned above regarding the present disclosure. Additionally, or alternatively, the storage device 1058 can store historical data similar to historical network data similar to the disclosed network of the present disclosure. The storage device 1058 can include a hard drive, an optical drive, a thumb-drive, an array of drives, or any combinations thereof.

The system can be linked through the bus 1056 optionally to a display interface (not shown) adapted to connect the system to a display device (not shown), wherein the display device can include a computer monitor, camera, television, projector, or mobile device, among others.

The computer/controller and the like 1011 can include a power source 1054, depending upon the application the power source 1054 may be optionally located outside of the computer 1011. Linked through bus 1056 can be a user input interface 1057 adapted to connect to a display device 1048, wherein the display device 1048 can include a computer monitor, camera, television, projector, or mobile device, among others. A printer interface 1059 can also be connected through bus 1056 and adapted to connect to a printing device 1032, wherein the printing device 1032 can include a liquid inkjet printer, solid ink printer, large-scale commercial printer, thermal printer, UV printer, or dye-sublimation printer, among others. A network interface controller (NIC) 1034 is adapted to connect through the bus 1056 to a network 1036, wherein data or other data, among other things, can be rendered on a third party display device, third party imaging device, and/or third party printing device outside of the computer 1011.

Still referring to FIG. 10, the data or other data, among other things, can be transmitted over a communication channel of the network 1036, and/or stored within the storage system 1058 for storage and/or further processing. Further, the data or other data may be received wirelessly or hard wired from a receiver 1046 (or external receiver 1038) or transmitted via a transmitter 1047 (or external transmitter 1039) wirelessly or hard wired, the receiver 1046 and transmitter 1047 are both connected through the bus 1056. Further, a GPS 1001 may be connected via bus 1056 to the computer 1011. The computer 1011 may be connected via an input interface 1008 to external sensing devices 1044 and external input/output devices 1041. The computer 1011 may be connected to other external computers 1042. An output interface 1009 may be used to output the processed data from the processor 1040.

All patents, patent applications, and published references cited herein are hereby incorporated by reference in their entirety. Emphasized is that the above-described embodiments of the present disclosure are merely possible examples of implementations, merely set forth for a clear understanding of the principles of the disclosure. Many variations and modifications may be made to the above-described embodiment(s) without departing substantially from the spirit and principles of the disclosure. Appreciated is that several of the above-disclosed and other features and functions, or alternatives thereof, may be desirably combined into many other different systems or applications. All such modifications and variations are intended to be included herein within the scope of this disclosure, as fall within the scope of the appended claims.

What is claimed is:

1. A method for predicting an unknown voltage of a battery corresponding to a future current demand for at least one time instant, while the battery is in communication with at least one processor connected to a memory, comprising:
   determining parameters of a first joint Gaussian distribution of a set of historical values of the voltage prediction of the battery from a set of historical measured physical quantities of the state of the battery stored in the memory;
   determining a second joint Gaussian distribution of the unknown voltage and the set of historical values of the voltage prediction of the battery, based on a present measured physical quantities of the battery, the set of historical measured physical quantities and the determined parameters of the first joint Gaussian distribution; and
   determining a mean and a variance of an unknown voltage of the battery from the second joint Gaussian distribution, wherein the mean is a prediction of the unknown voltage of the battery, and the variance is a confidence of the prediction, so as to obtain the predicted unknown voltage of the battery corresponding to the future current demand for the at least one time instant, wherein steps of the method are determined using the at least one processor and the memory.

2. The method of claim 1, wherein the set of historical measured physical quantities of the state of the battery include one of, a current, a voltage, a temperature or some combination thereof, at one or more consecutive time instants.

3. The method of claim 1, wherein the predicted mean and variance of the unknown voltage of the battery is determined using a feedback of at least one previously determined one of means, variance, or both, of the unknown voltage prediction.

4. The method of claim 1, wherein the present measured physical quantities of the battery are obtained from measurement devices such as sensing devices coupled to an electronic circuit structure, attached to a battery supply.

5. The method of claim 1, wherein determining the first joint Gaussian distribution includes determining a distribution, of the set of historical values of the voltage prediction of the battery by identifying a statistical distance between each historical measured value and at least one historical measured value from the set of historical values of the voltage prediction of the battery based on parameters of the first joint Gaussian distribution.

6. The method of claim 5, wherein the parameters of the first joint Gaussian distribution are determined by maximizing the first joint Gaussian distribution of the set of historical values of the voltage prediction of the battery using an optimization algorithm.

7. The method of claim 1, wherein the determining the second joint Gaussian distribution of the unknown voltage and the set of historical values of the voltage prediction of the battery by identifying a statistical distance between the present measured physical quantities of the battery and the historical measured physical quantities based on the determined parameters of the first joint Gaussian distribution.

8. The method of claim 1, wherein the determining the mean and the variance of the unknown voltage of the battery from the second joint Gaussian distribution by evaluating a probability distribution of the unknown voltage from the second joint Gaussian distribution.

9. The method of claim 8, wherein evaluating the probability distribution of the unknown voltage from the second joint Gaussian distribution includes determining a probability distribution of only unknown voltage.

10. The method of claim 1, further comprising using a sparse learning module for at least one step in estimating the voltage prediction of a battery to reduce an amount of the historical data.

11. The method of claim 1, wherein the set of historical measured physical quantities of the state of the battery include one of, an ambient temperature, a volume and a gas leak measurement from the battery, aging of the battery, leakage of current over time of the battery, error rate of the measured physical quantities of the state of the battery and other related error related data.

12. The method of claim 1, further comprising:
predicting an another unknown voltage of the battery corresponding to a future current demand at an another time instant using a feedback of at least one previously determined predicted mean of the unknown voltage of the battery.

13. The method of claim 1, further comprising:
predicting an another unknown voltage of the battery corresponding to a future current demand at an another time instant using a feedback of at least one previously determined predicted mean and variance of the unknown voltage of the battery.

14. A method for predicting an unknown current of a rechargeable battery corresponding to a future voltage demand for at least one time instant, while the rechargeable battery is in communication with at least one processor connected to a memory, comprising:

determining parameters of a first joint Gaussian distribution of a set of historical values of the current prediction of the rechargeable battery from a set of historical measured physical quantities of the state of the rechargeable battery stored in the memory;

determining a second joint Gaussian distribution of the unknown voltage and the set of historical values of the current prediction of the rechargeable battery, based on a present measured physical quantities of the rechargeable battery, the set of historical measured physical quantities and the determined parameters of the first joint Gaussian distribution; and determining a mean and a variance of an unknown current of the rechargeable battery from the second joint Gaussian distribution, wherein the mean is a prediction of the unknown current of the rechargeable battery, and the variance is a confidence of the prediction, so as to obtain the predicted unknown current of the rechargeable battery corresponding to the future voltage demand for the at least one time instant, wherein steps of the method are determined using the at least one processor and the memory.

15. A system for predicting an unknown voltage of a battery corresponding to a future current demand for at least one time instant, comprising:

a memory having stored thereon data including battery related data and data for predicting unknown voltage of batteries corresponding to future current demands;

at least one processor operatively connected to the memory, the processor is configured to determine parameters of a first joint Gaussian distribution of a set of historical values of the voltage prediction of the battery from a set of historical measured physical quantities of the state of the battery stored in the memory;

determine a second joint Gaussian distribution of the unknown voltage and the set of historical values of the voltage prediction of the battery, based on a present measured physical quantities of the battery, the set of historical measured physical quantities and the determined parameters of the first joint Gaussian distribution; and determine a mean and a variance of an unknown voltage of the battery from the second joint Gaussian distribution, wherein the mean is a prediction of the unknown voltage of the battery, and the variance is a confidence of the prediction, so as to obtain the predicted unknown voltage of the battery corresponding to the future current demand for the at least one time instant.

16. The system of claim 15, further comprising:
predicting an another unknown voltage of the battery corresponding to a future current demand at an another time instant using a feedback of at least one previously determined predicted unknown voltage of the battery.

17. The system of claim 15, further comprising:
predicting an another unknown voltage of the battery corresponding to a future current demand at an another time instant using a feedback of at least one previously determined predicted mean of the unknown voltage of the battery.

18. The system of claim 15, wherein the determining the second joint Gaussian distribution of the unknown voltage and the set of historical values of the voltage prediction of the battery by identifying a statistical distance between the present measured physical quantities of the battery and the historical measured physical quantities based on the determined parameters of the first joint Gaussian distribution.

19. The system of claim 15, wherein the system includes one of at least one sensor, outputs of sensors measuring physical quantities of the battery, an inertial measurement unit, a transceiver, at least one display operatively coupled to other components through connections, or some combination thereof.

20. The system of claim 15, wherein determining the first joint Gaussian distribution includes
- determining a distribution, of the set of historical values of the voltage prediction of the battery by identifying a statistical distance between each historical measured value and at least one historical measured value from the set of historical values of the voltage prediction of the battery based on parameters of the first joint Gaussian distribution,
- wherein the parameters of the first joint Gaussian distribution are determined by maximizing the first joint Gaussian distribution of the set of historical values of the voltage prediction of the battery using an optimization algorithm.

\* \* \* \* \*